US008889265B2

(12) United States Patent
Suzuki et al.

(10) Patent No.: US 8,889,265 B2
(45) Date of Patent: Nov. 18, 2014

(54) COPOLYMER AND POLYMER LIGHT EMITTING DEVICE USING THE SAME

(75) Inventors: Tomoyuki Suzuki, Tsukuba (JP); Takanobu Noguchi, Tsukuba (JP); Chizu Sekine, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 1632 days.

(21) Appl. No.: 11/037,046

(22) PCT Filed: Jul. 18, 2003

(86) PCT No.: PCT/JP03/09148
§ 371 (c)(1),
(2), (4) Date: Mar. 30, 2005

(87) PCT Pub. No.: WO2004/009668
PCT Pub. Date: Jan. 29, 2004

(65) Prior Publication Data
US 2005/0153167 A1 Jul. 14, 2005

(30) Foreign Application Priority Data

Jul. 22, 2002 (JP) ................................ 2002-212138
Feb. 28, 2003 (JP) ................................ 2003-053077

(51) Int. Cl.
H01L 51/54 (2006.01)
H01L 51/00 (2006.01)
C08G 61/12 (2006.01)
C08G 61/08 (2006.01)
C09K 11/06 (2006.01)
H01L 51/50 (2006.01)

(52) U.S. Cl.
CPC ........ *H01L 51/0043* (2013.01); *H01L 51/0085* (2013.01); *H01L 51/0035* (2013.01); *C08G 61/126* (2013.01); *C09K 2211/14* (2013.01); *C09K 2211/1425* (2013.01); *H01L 51/0094* (2013.01); *C09K 2211/185* (2013.01); *H01L 51/0052* (2013.01); *C09K 2211/1011* (2013.01); *C09K 2211/1458* (2013.01); *C09K 2211/1003* (2013.01); *C08G 61/08* (2013.01); *C09K 2211/1433* (2013.01); *H01L 51/5012* (2013.01); *C09K 2211/1416* (2013.01); *H01L 51/0059* (2013.01); *C08G 61/125* (2013.01); *C09K 11/06* (2013.01); *H01L 51/007* (2013.01); *C08G 61/122* (2013.01); *Y10S 428/917* (2013.01)
USPC ........... 428/690; 428/917; 313/504; 313/505; 313/506; 257/40; 257/E51.05; 257/E51.026; 257/E51.032; 564/26; 564/426; 564/430; 564/432; 564/434

(58) Field of Classification Search
USPC ................ 428/690, 917; 313/504, 505, 506; 564/26, 426, 434, 430, 432; 257/40, 257/E51.05, E51.026, E51.032
See application file for complete search history.

(56) References Cited

U.S. PATENT DOCUMENTS

| 5,777,070 | A  | * | 7/1998  | Inbasekaran et al. | ......... | 528/394 |
| 5,821,002 | A  |   | 10/1998 | Ohnishi et al.     |           |         |
| 6,099,980 | A  | * | 8/2000  | Schoo et al.       | .................. | 428/690 |
| 6,207,301 | B1 | * | 3/2001  | Ohnishi et al.     | ................ | 428/690 |
| 6,399,224 | B1 | * | 6/2002  | Li                 | ..................... | 428/690 |
| 6,413,658 | B1 | * | 7/2002  | Araki              | ............................ | 428/690 |
| 6,818,733 | B2 |   | 11/2004 | Yamazaki et al.    |           |         |
| 6,824,892 | B2 |   | 11/2004 | Sohn et al.        |           |         |
| 2001/0012572 | A1 | * | 8/2001 | Araki            | ............................ | 428/690 |
| 2002/0028347 | A1 | * | 3/2002 | Marrocco et al.  | ............. | 428/690 |
| 2002/0061420 | A1 |   | 5/2002 | Sohn et al.      |           |         |
| 2003/0091862 | A1 | * | 5/2003 | Tokito et al.    | .................. | 428/690 |
| 2003/0224205 | A1 | * | 12/2003 | Li et al.       | ........................ | 428/690 |
| 2004/0054095 | A1 |   | 3/2004 | Allen et al.     |           |         |
| 2004/0135131 | A1 | * | 7/2004 | Treacher et al.  | .............. | 252/582 |
| 2006/0093852 | A1 |   | 5/2006 | Marsitzky et al. |           |         |

FOREIGN PATENT DOCUMENTS

| DE | 698 08 796 T2 | 6/2003 |           |
| EP | 1 149 827 A1  | 10/2001 |          |
| EP | 1149827       | * 10/2001 | ............ C07C 211/55 |
| JP | 04-285635 A   | 10/1992 |          |
| JP | 08-191162 A   | 7/1996  |          |
| JP | 09-045478     | 2/1997  |          |
| JP | 9-45478 A     | 2/1997  |          |
| JP | 10-114891     | 5/1998  |          |
| JP | 2000-299189 A | 10/2000 |          |
| JP | 2001-72745 A  | 3/2001  |          |
| JP | 2001-213945 A | 8/2001  |          |
| JP | 2002-003834   | 1/2002  |          |
| JP | 2002-056970   | 2/2002  |          |
| JP | 2002-216965   | 8/2002  |          |

(Continued)

OTHER PUBLICATIONS

Kotov et al., Photogeneration and photovoltaic properties of polyimides with extended charge delocalisation in polymer chains, 2001, Synthetic Metals, 2001, pp. 1553-1554.*
International Search Report mailed on Nov. 4, 2003 issued in PCT Application PCT/JP03/09148.
Notice of Reasons for Rejection mailed Feb. 24, 2009 from the Japanese Patent Office in Japanese Application No. 2003-199023.
Decision of Rejection mailed May 11, 2010 from the Japanese Patent Office in Japanese Application No. 2003-199023.
Report of Pre-Appeal Reconsideration and Invitation to Reply mailed Mar. 27, 2012 from the Japanese Patent Office in Japanese Application No. 2003-199023.
Notice of Reasons for Rejection mailed May 11, 2010 from the Japanese Patent Office in Japanese Application No. 2009-102762.
Notice of Reasons for Rejection mailed Oct. 12, 2010 from the Japanese Patent Office in Japanese Application No. 2009-102762.
German Office Action issued on Jul. 21, 2014 from German Patent Office in German Application No. 103 92 958.4.

*Primary Examiner* — Gregory Clark
(74) *Attorney, Agent, or Firm* — Sughrue Mion, PLLC

(57) ABSTRACT

A copolymer having two or more repeating units selected from the group consisting of arylene groups, divalent heterocyclic groups and divalent aromatic amine groups wherein the copolymer has, on at least one of molecular chain ends, a monovalent heterocyclic group, a monovalent group derived from a heterocyclic group coordinated metal complex, and an aromatic end group selected from aryl groups having a formula weight of 90 or more, and the copolymer shows fluorescence in the solid state and has a polystyrene-reduced weight-average molecular weight of $10^3$ to $10^8$.

24 Claims, No Drawings

(56) References Cited

FOREIGN PATENT DOCUMENTS

| | | | |
|---|---|---|---|
| JP | 2002-220439 | | 8/2002 |
| JP | 2002-293888 | | 10/2002 |
| WO | 97/05184 | A1 | 2/1997 |
| WO | 99/20675 | A1 | 4/1999 |
| WO | WO 99/32537 | * | 7/1999 ............. C08G 73/00 |
| WO | 99/48160 | A1 | 9/1999 |
| WO | 99/54385 | A1 | 10/1999 |
| WO | 01/42331 | A1 | 6/2001 |
| WO | 01/49769 | A1 | 7/2001 |
| WO | WO 02/077060 | * | 10/2002 |
| WO | 03/089542 | A1 | 10/2003 |
| WO | 03/102109 | A1 | 12/2003 |
| WO | 03/103070 | A2 | 12/2003 |

* cited by examiner

COPOLYMER AND POLYMER LIGHT EMITTING DEVICE USING THE SAME

TECHNOLOGICAL FIELD

The present invention relates to a copolymer and a polymer light emitting device (hereinafter, referred to as polymer LED in some cases) using the same.

BACKGROUND TECHNOLOGY

Light emitting materials of high molecular weight are variously investigated since they are soluble in a solvent and capable of forming a light emitting layer in a light emitting device by an application method, differing from those of low molecular weight, and as the examples, there are known copolymers having two kinds of repeating units containing an aromatic ring in the main chain and having a phenyl group as the end group (formula weight 77), which is an aryl group (International publication Nos. 99/54385, 01/49769, U.S. Pat. No. 5,777,070).

However, when the above-mentioned copolymer is used as a light emitting material for a light emitting layer of a polymer LED, properties as a polymer LED such as time of luminance decreasing, light emitting efficiency and the like of the polymer LED are not practically satisfactory yet, and there is a desire for a copolymer showing more excellent properties when used as a light emitting material of a light emitting layer of a polymer LED.

DISCLOSURE OF THE INVENTION

An object of the present invention is to provide a copolymer which is used as a light emitting material for a light emitting layer of a polymer LED showing excellent properties.

The present inventors have intensively studied to solve the above-mentioned problem, and resultantly found that when a copolymer having an aromatic end group selected from a monovalent heterocyclic group, a monovalent group derived from a heterocyclic group coordinated metal complex, and aryl groups having a formula weight of 90 or more, as an end group, on at least one of molecular chain ends of the copolymer is used as a light emitting material for a light emitting layer of a polymer LED, its polymer LED shows excellent properties, leading to completion of the invention.

Namely, the present invention relates to a copolymer having two or more repeating units selected from the group consisting of arylene groups, divalent heterocyclic groups and divalent aromatic amine groups wherein the copolymer has, on at least one of molecular chain ends, an aromatic end group selected from monovalent heterocyclic group, a monovalent group derived from a heterocyclic group coordinated metal complex, and aryl groups having a formula weight of 90 or more, and the copolymer shows fluorescence in the solid state and has a polystyrene-reduced weight-average molecular weight of $10^3$ to $10^8$.

BEST MODE FOR CARRYING OUT THE INVENTION

Hereafter, the copolymer and the polymer LED of the present invention will be explained in detail.

In the aromatic end group, the monovalent heterocyclic group means an atomic group in which one hydrogen is removed from a heterocyclic compound, and the number of the carbon atoms is usually about 4 to 60, and preferably 4 to 20. The number of the carbon atoms of the substituents is not counted as the number of the carbon atoms of the monovalent heterocyclic group. Here, the heterocyclic group is a group having a cyclic structure in which at least one heteroatom such as oxygen, sulfur, nitrogen, silicon, phosphorus, boron, etc. is contained in the cyclic structure as the element other than carbon atoms.

As the monovalent heterocyclic group, exemplified are:

a group having fluorene structure and a hetero atom;

5 membered-ring heterocyclic group containing hetero atom;

6 membered-ring heterocyclic group containing hetero atom; condensed-ring heterocyclic group having 5 membered-ring heterocyclic group containing hetero atom or 6 membered-ring heterocyclic group containing hetero atom;

5 membered-ring heterocyclic group containing a hetero atom, which is connected at the a position of the hetero atom to form a dimer or an oligomer;

5 membered-ring heterocyclic group containing a hetero atom which is connected with a phenyl group at the a position of the hetero atom. As the hetero atom, nitrogen, oxygen, sulfur, silicon, selenium, phosphorus, and boron are exemplified, and nitrogen, oxygen, and sulfur are preferable. In case of the 6 membered-ring heterocyclic group containing hetero atom, it is preferable that the hetero atom is nitrogen. As the group having fluorene structure and a hetero atom, the following groups are exemplified.

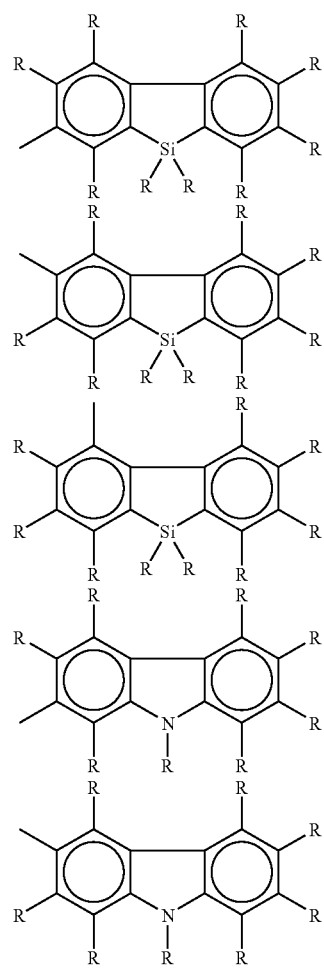

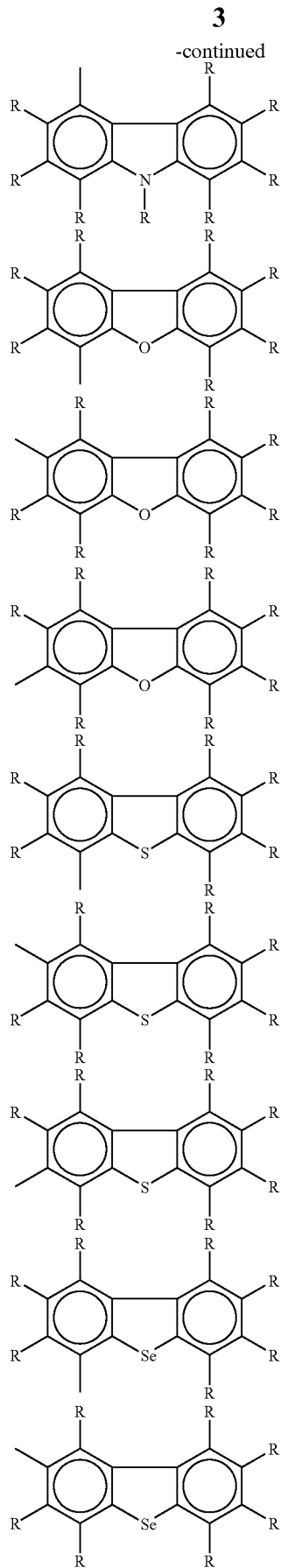
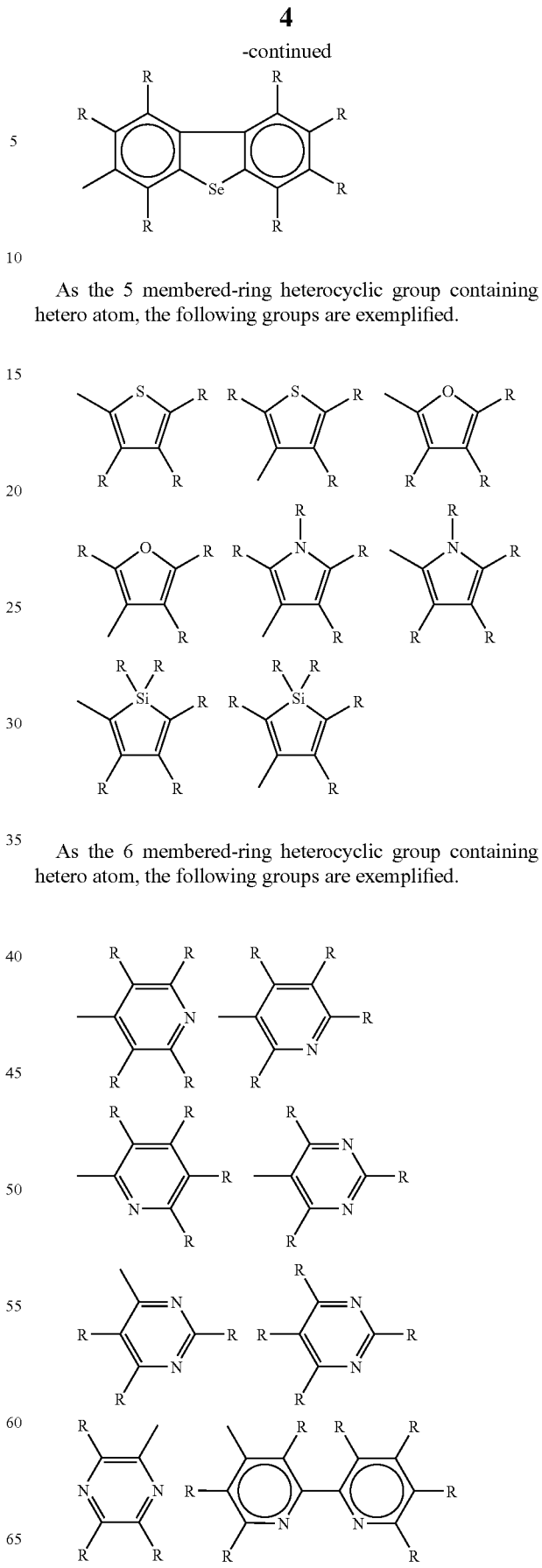
As the 5 membered-ring heterocyclic group containing hetero atom, the following groups are exemplified.
As the 6 membered-ring heterocyclic group containing hetero atom, the following groups are exemplified.

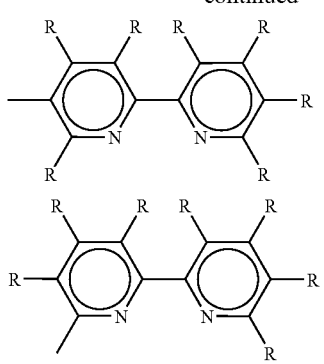
As the condensed-ring heterocyclic group having 5 membered-ring heterocyclic group containing hetero atom or 6 membered-ring heterocyclic group containing hetero atom, the following groups are exemplified.
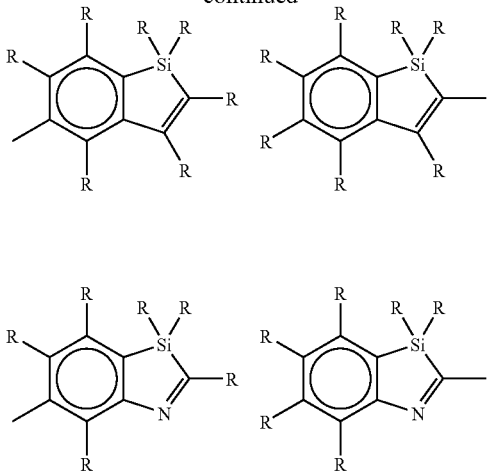
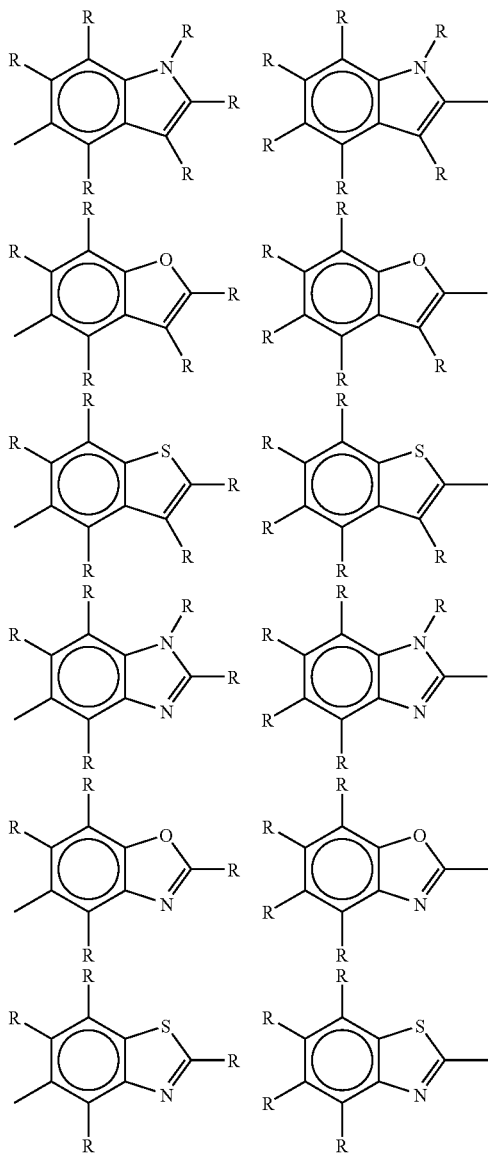
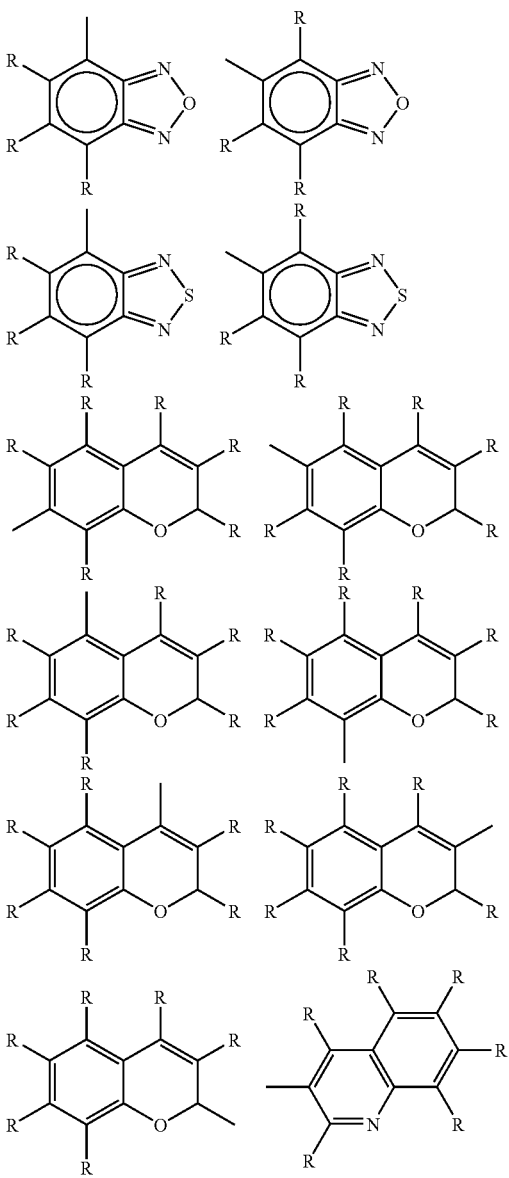

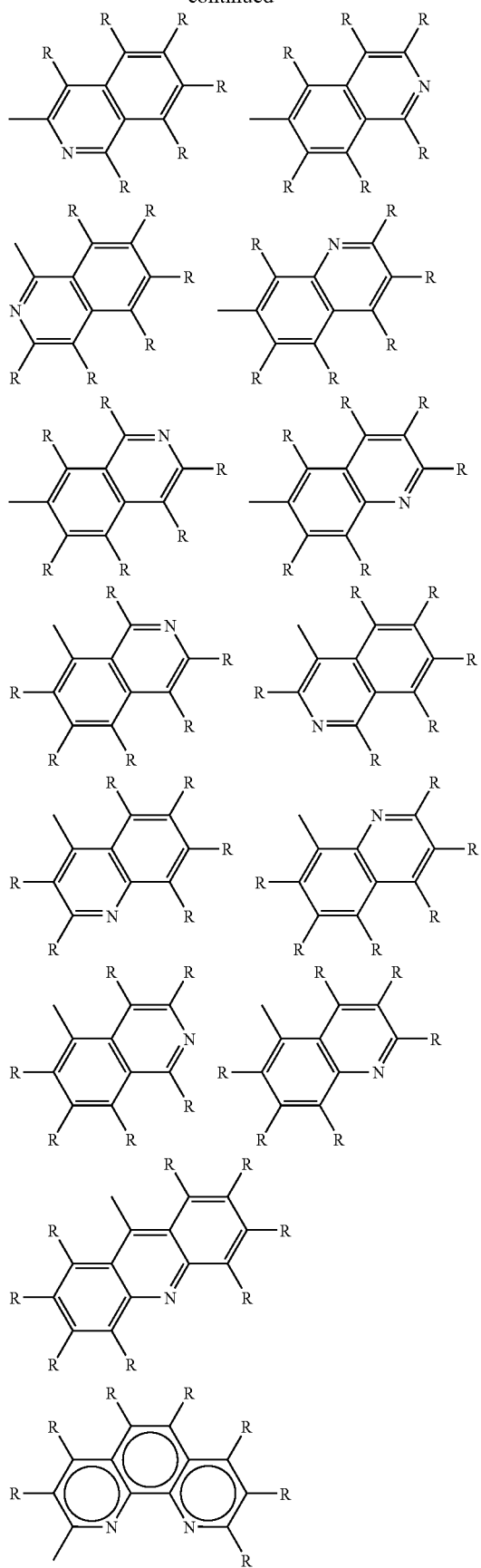

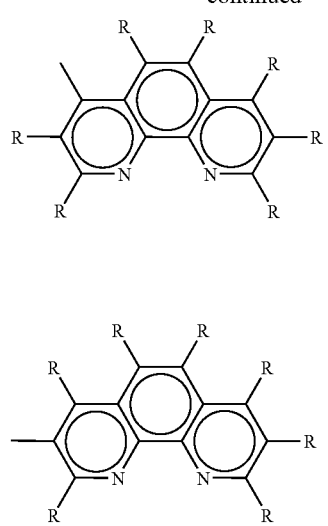

As the 5 membered-ring heterocyclic group S containing a hetero atom, which are connected at the a position of the hetero atom to form a dimer or an oligomer, the following groups are exemplified.

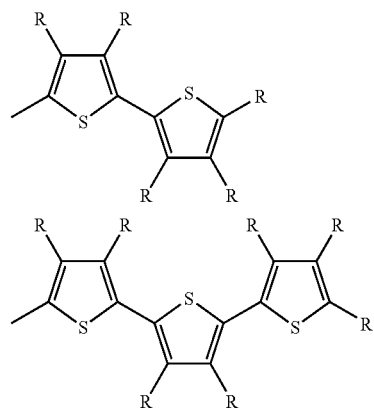

As the 5 membered-ring heterocyclic group containing a hetero atom, which is connected with a phenyl group at the a position of the hetero atom, the following groups are exemplified.

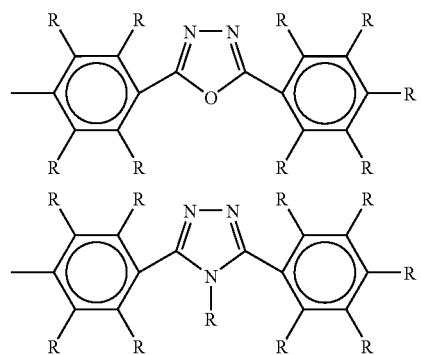

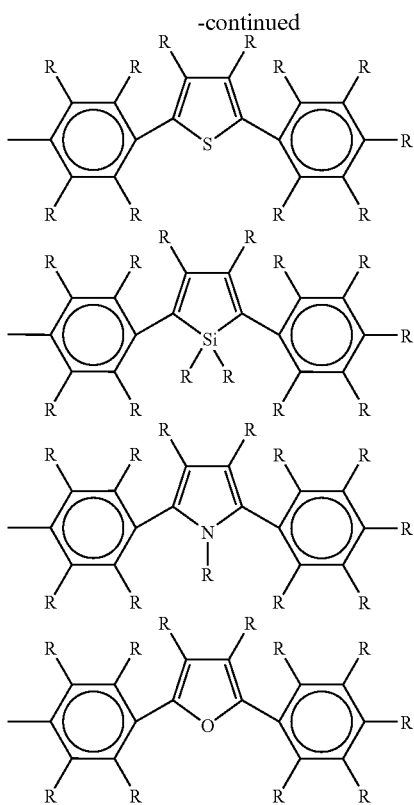

Here, as R in the example of the above monovalent heterocyclic group, hydrogen atom, alkyl group, alkoxy group, alkylthio group, alkylsilyl group, alkylamino group, hydroxyl group, amino group, carboxyl group, aldehyde group, cyano group, etc. are exemplified. A plurality of R are contained in one group of the above figure, these may be the same, or different from each other.

Here, the alkyl group may be any of linear, branched or cyclic, and the number of carbon atoms is usually from about 1 to 20, and examples thereof include methyl group, ethyl group, propyl group, and i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, etc.

The alkoxy group may be any of linear, branched or cyclic, and the number of carbon atoms is usually from about 1 to 20, and examples thereof include methoxy group, ethoxy group, propyloxy group, and i-propyloxy group, butoxy group, i-butoxy group, t-butoxy group, pentyloxy group, isoamyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, etc.

The alkylthio group may be any of linear, branched or cyclic, and the number of carbon atoms is usually from about 1 to 20, and examples thereof include methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, etc.

The alkylsilyl group may be any of linear, branched or cyclic, and the number of carbon atoms is usually from about 1 to 60, and examples thereof include methylsilyl group, ethylsilyl group, propylsilyl group, i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, lauryldimethylsilyl group, etc.

The alkylamino group may be any of linear, branched or cyclic, and include monoalkylamino group and dialkylamino group. The number of carbon atoms is usually from about 1 to 40, and examples thereof include methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, etc.

In the aromatic end group, the monovalent group derived from a heterocyclic group coordinated metal complex means an atomic group in which one hydrogen atom is removed from a ligand of the metal complex which has a heterocyclic compound as a ligand (heterocyclic group coordinated metal complex). The number of carbon atoms of themonovalent group derived from heterocyclic group coordinated metal complex, without including the substituent, is usually 4 to about 60.

As the metal atom which is a central metal of heterocyclic group coordinated metal complex is a metal which has an atomic number of 50 or more, and the intersystem crossing between singlet state and triplet state can occur in this complex by spin-orbital mutual action is preferable. As the metal atom, specifically, iridium, platinum, europium, gold, etc. are exemplified. As the heterocyclic compound which is a ligand of heterocyclic group coordinated metal complex, for example, quinolinol, benzoquinolinol, phenylpyridine, phenylbenzothiazole, phenylbenzoxazole, porphyrin, carbazole, etc. are exemplified.

As themonovalent group derived from heterocyclic group coordinated metal complex, for example, the below groups are exemplified.

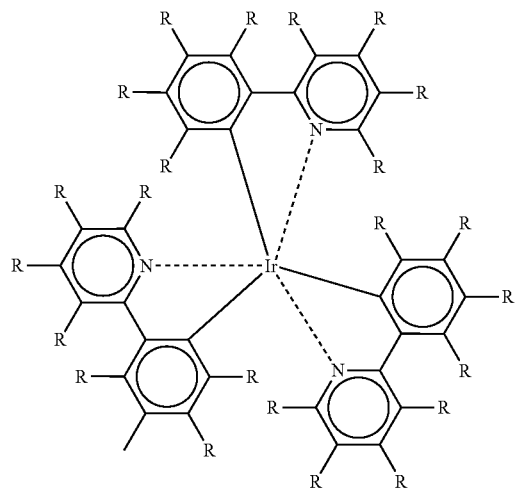

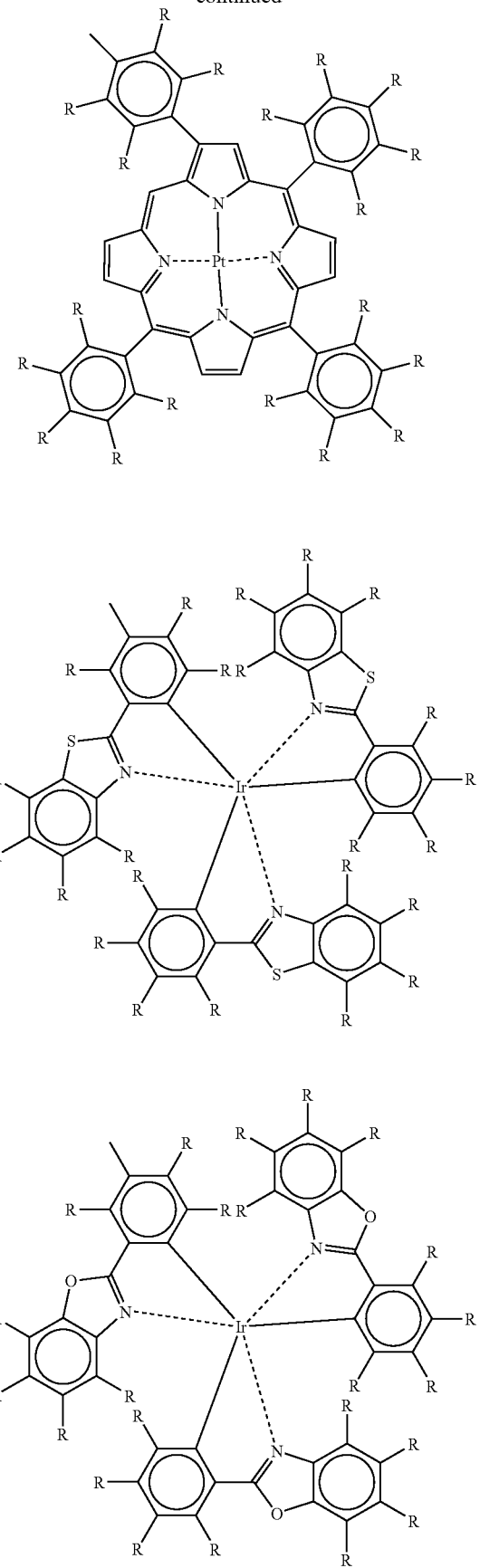
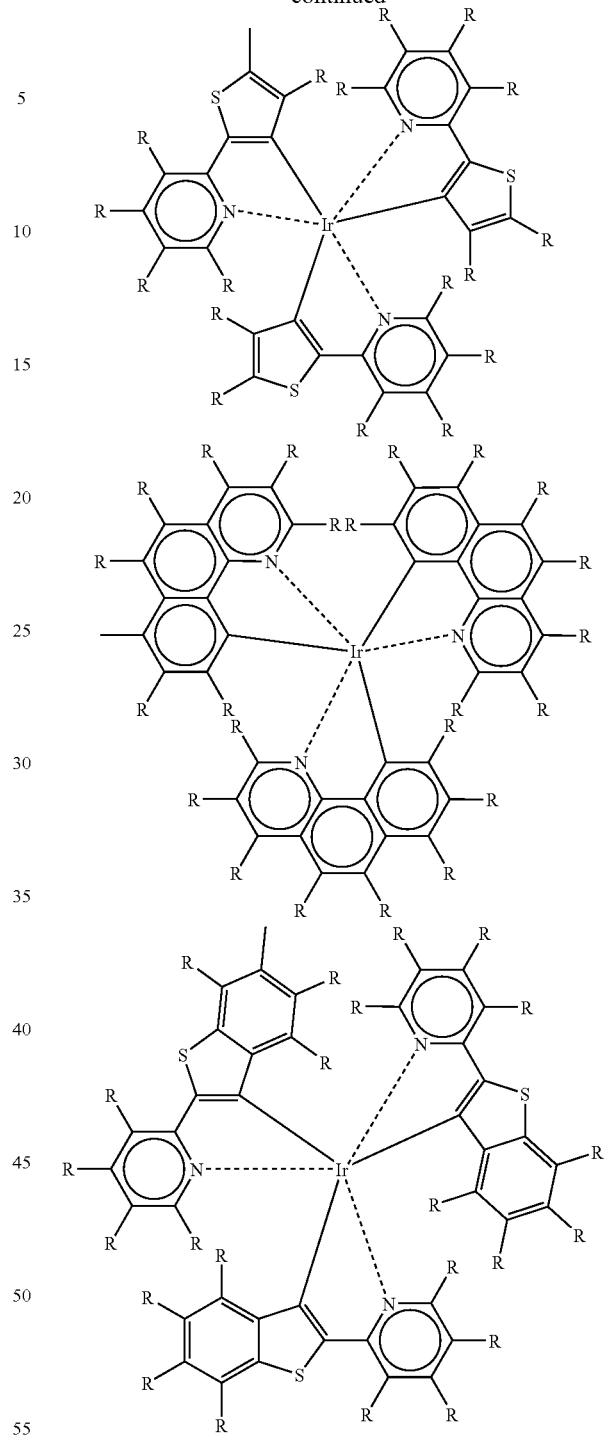

As R in the example of the monovalent group derived from the above heterocyclic group coordinated metal complex, hydrogen atom, alkyl group, alkoxy group, alkylthio group, alkylsilyl group, alkylamino group, hydroxyl group, amino group, carboxyl group, aldehyde group, cyano group, etc. are exemplified; alkyl group, alkoxy group, hydroxyl group, amino group, carboxyl group and aldehyde group are preferable; n-alkyl group, i-alkyl group, s-alkyl group, alkoxy group, hydroxyl group, amino group, carboxyl group, and aldehyde group are more preferable; and n-alkyl group, i-alkyl group, s-alkyl group, and alkoxy group are further preferable. In the above figures, a plurality of R exist in one group, they may be the same or different from each other. It is preferable that at least one of the Rs is a group other than hydrogen atom.

In the aromatic end group of the copolymer of the present invention, aryl groups having a formula weight of 90 or more, have a number of carbon atoms of usually about 6 to 60, and the groups shown as following figures are specifically exemplified. Here, the formula weight of aryl group means the sum of the products of multiplying the atomic weight by the number of atoms as for each atoms in the chemical formula of the aryl group.

As the aryl group, phenyl group, naphtyl group, anthracenyl group, groups having fluorene structure, condensed ring compound group, etc. are exemplified.

Examples of the phenyl group include

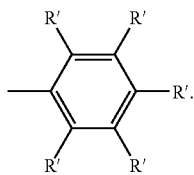

Examples of the naphtyl group include

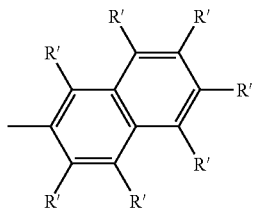

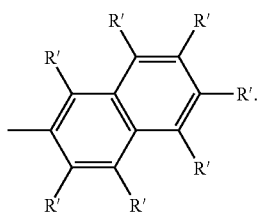

Examples of the anthracenyl group include

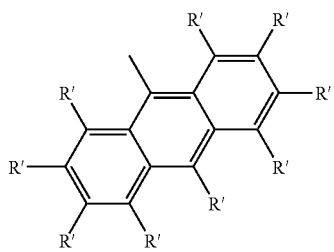

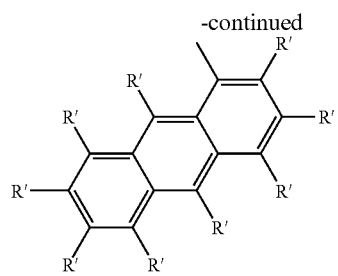

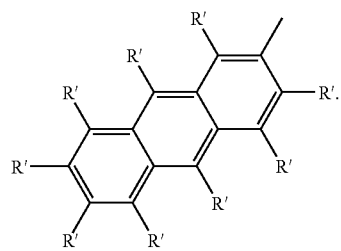

Examples of the group containing fluorene structure include

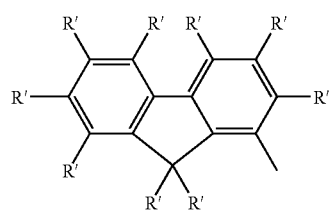

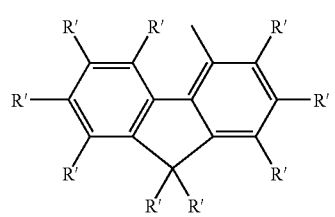

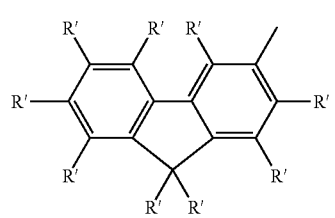

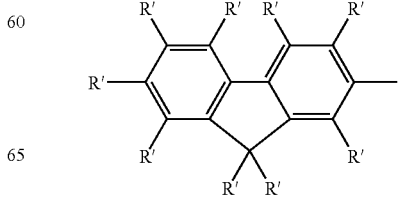

Examples of the condense ring compound group include

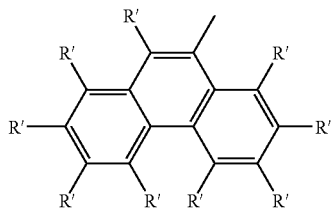

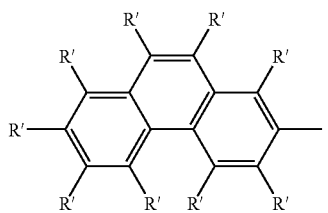

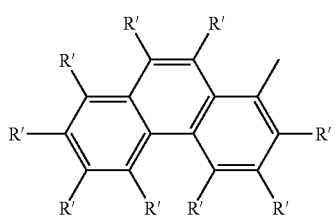

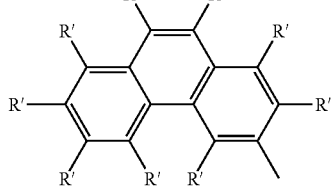

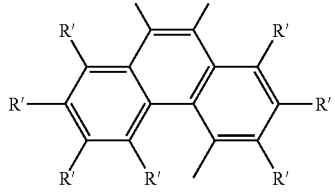

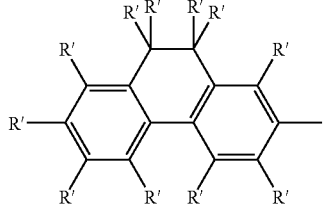

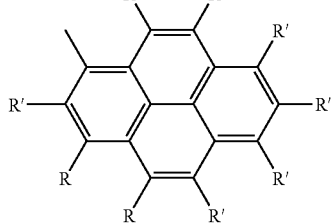

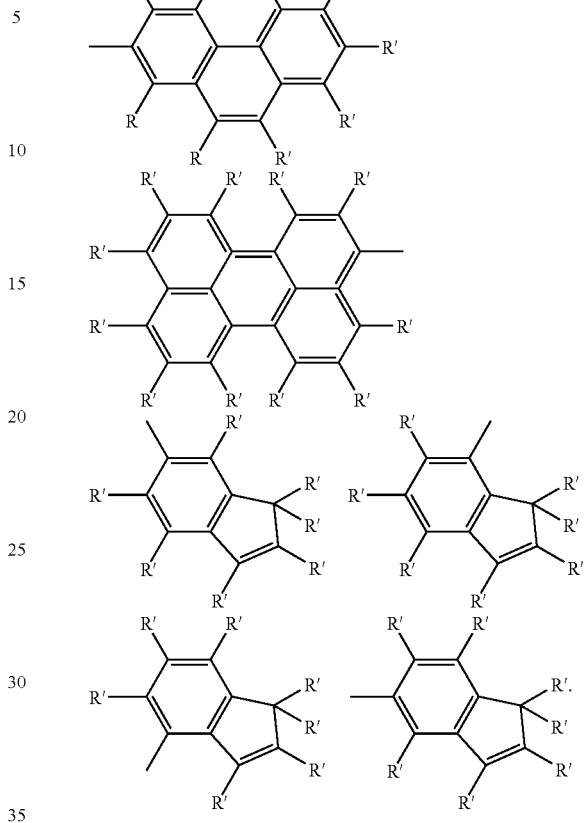

As R' in the example of the above aryl groups, hydrogen atom, alkyl group, alkoxy group, alkylthio group, alkylsilyl group, alkylamino group, hydroxyl group, amino group, arylamino group, carboxyl group, aldehyde group, cyano group etc. are exemplified; alkyl group, alkoxy group, hydroxyl group, arylamino group, amino group, carboxyl group, and aldehyde group are preferable; n-alkyl group, i-alkyl group, s-alkyl group, alkoxy group, hydroxyl group, arylamino group, amino group, carboxyl group and aldehyde group are more preferable; n-alkyl group, i-alkyl group, s-alkyl group, alkoxy group, arylamino group are further preferable; n-alkyl group, and arylamino group are still further preferable; and arylamino group and methyl group are the most poeferable. In the above figures, a plurality of R' exist in one group, they may be the same or different from each other.

Here, examples of the arylamino group include

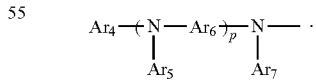

In the aryl group, it is preferable that at least one of the R's is a group other than hydrogen atom. It is more preferable that the number of substituents other than hydrogen atom is 1-3. It is more preferable that the aryl group is a phenyl group, and a substituent bonds at the para-position of the phenyl group from the bonding position of the repeating unit; or substituents bond at the para- and two ortho-positions of the phenyl group from the bonding position of the repeating unit.

It is preferable that the aryl group which is an aromatic end group having a formula weight of 90 or more is an aryl group having 1 to 3 substituents selected from n-alkyl group, i-alkyl group, s-alkyl group, t-butyl group, or alkoxy group.

Moreover, it is preferable that the aryl group having a formula weight of 90 or more is an aryl group which has an arylamino group as a substituent (monovalent aromatic amine group: a remaining atomic group in which one hydrogen atom is removed from an aromatic ring of an aromatic amine). Examples of the aryl group having such arylamino group include, for example, the group shown by formula (6).

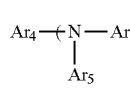
(6)

In the formula, $Ar_6$ and $Ar_8$ each independently represent arylene group, and $Ar_4$, $Ar_5$, and $Ar_7$ each independently represent aryl group. p represents an integer of 0 to 3. When two or more of Ar5 and Ar6 exist, respectively, they may be the same or different.

Here, the arylene group is an atomic group in which two hydrogen atoms are removed from an aromatic hydrocarbon, and groups in which independent benzene rings or two or more condensed rings are connected through a group, such as direct bond or vinylene, are also contained. The number of carbon atoms of unsubstituted arylene group is usually about 6 to 60. Examples of the arylene group include phenylene group, biphenylene group, terphenylene group, naphthalenediyl group, anthracenediyl group, phenanthrenediyl group, pentalenediyl group, indenediyl group, heptalenediyl group, indacenediyl group, tri phenylenediyl group, binaphthyldiyl group, phenylnaphthylenediyl group, stilbenediyl group, 3,3'-alkoxystilbenediyl group, etc.

Concrete examples of the arylene group include a group in which one of R's of the above aryl group is a connecting bond. (However, there is no case where R' is an arylamino group).

As the aryl groups, the same groups exemplified as the above aromatic end groups are exemplified. (However, there is no case where R' is an arylamino group).

Concrete examples of the aryl group having an arylamino group as a substituent include the groups shown below.

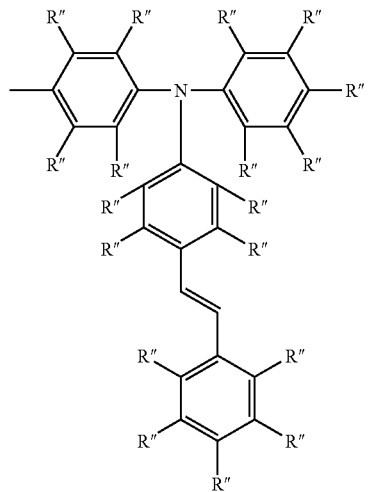

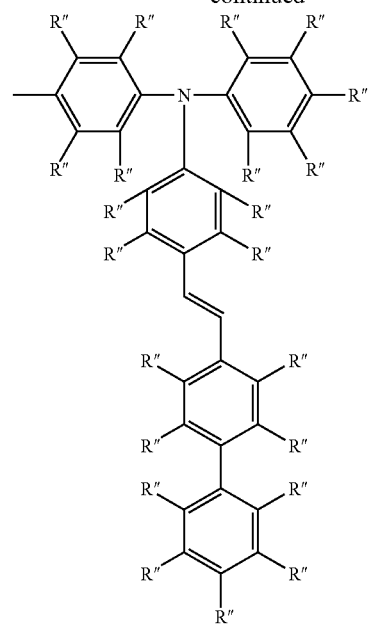

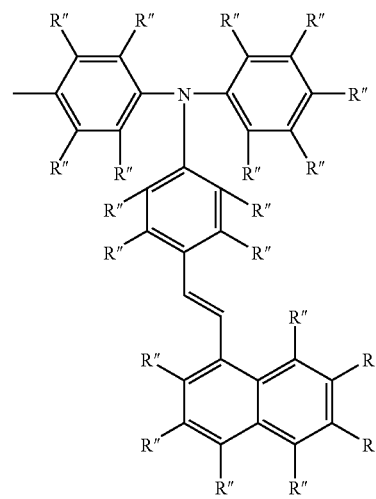

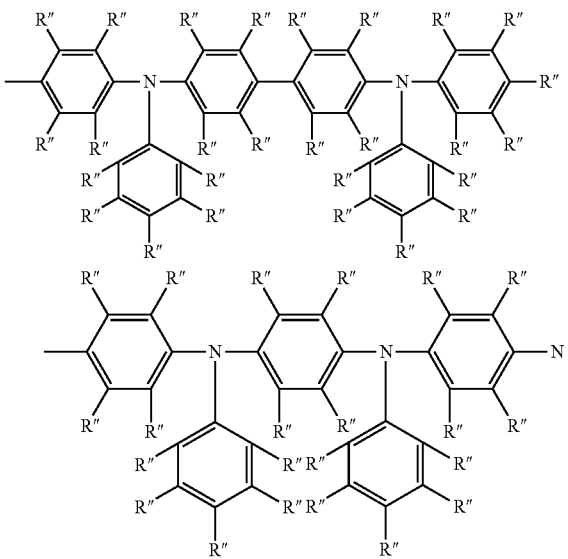

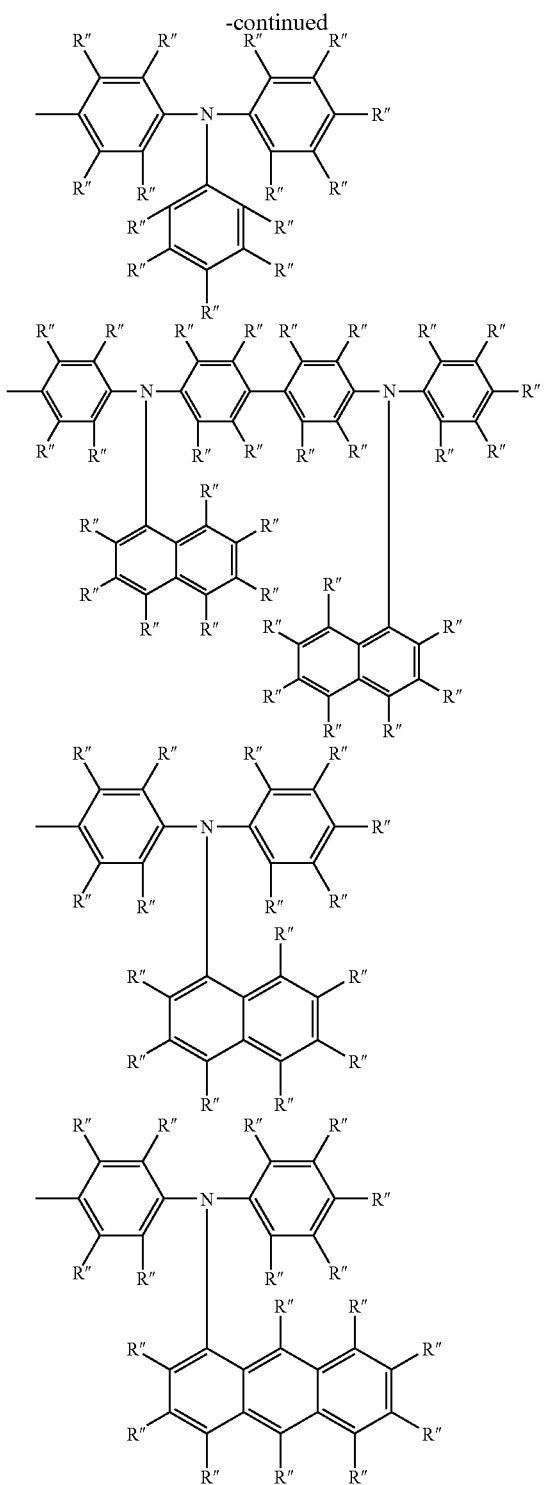

As R″ in the above concrete example of the aryl group having arylamino group, hydrogen atom, alkyl group, alkoxy group, alkylthio group, alkylsilyl group, alkylamino group, hydroxyl group, amino group, carboxyl group, aldehyde group, cyano group, etc. are exemplified. Alkyl group, alkoxy group, hydroxyl group, amino group, carboxyl group and aldehyde group are preferable; n-alkyl group, i-alkyl group, s-alkyl group, alkoxy group, hydroxyl group, amino group, carboxyl group, and aldehyde group are more preferable; and n-alkyl group, i-alkyl group, s-alkyl group, and alkoxy group are further preferable. A plurality of R″ are contained in one group of the above formula, they may be the same or different from each other.

The copolymer of the present invention has a monovalent heterocyclic group, a monovalent group derived from heterocyclic group coordinated metal complex, or an aryl group having a formula weight of 90 or more at the terminals, and has the effect of retarding the luminance falling of a device, the effect of improving the light emitting efficiency of a device, the effect of improving the hole transporting property, electron transporting property, light emitting property, etc., the effect of improving the compatibility and interaction between copolymers, and the anchor effect.

As the aromatic end group, for example, by using an aryl group having arylamino group or the following group, the hole transporting property can be improved.

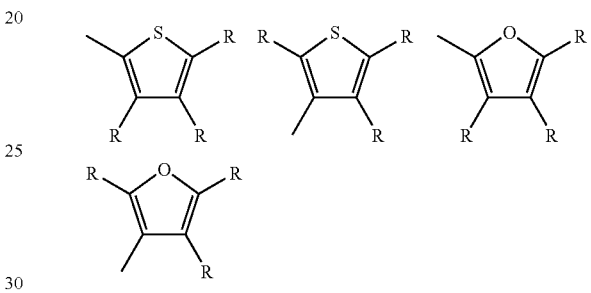

Here, R in the formula means the same as above.

In order to improve a hole transporting property, the following groups are preferable,

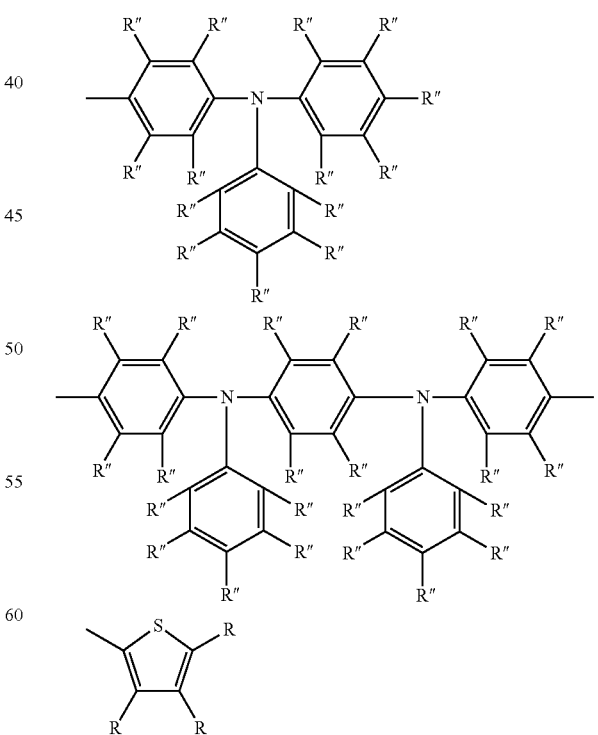

and the following groups are more suitable.

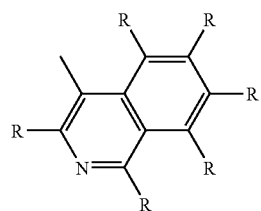

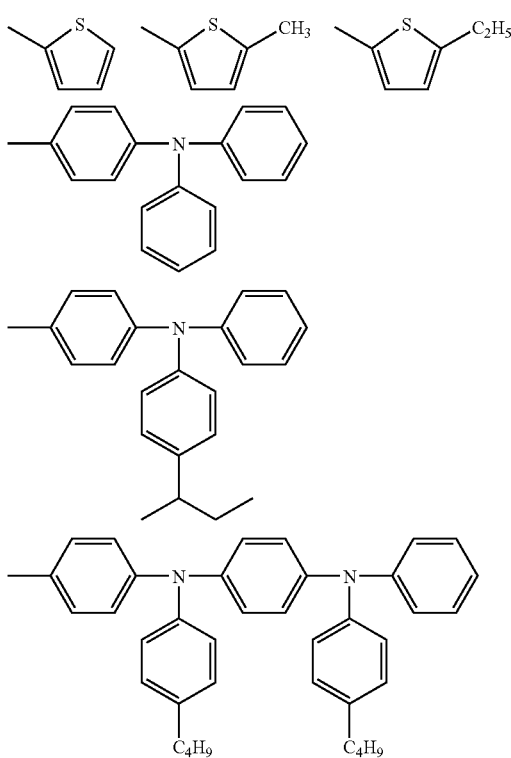

As the aromatic end group, for example, by using the following groups, the electron transporting property can be improved.

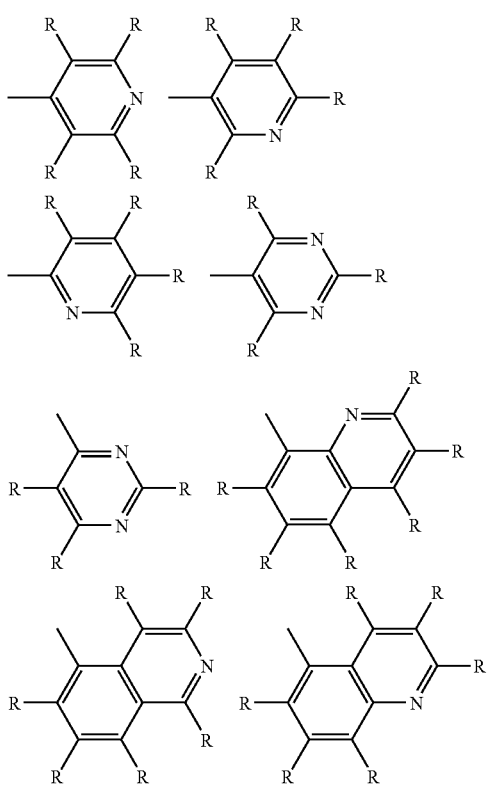

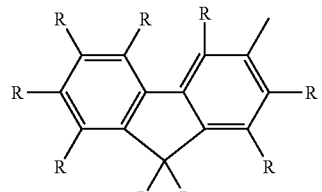

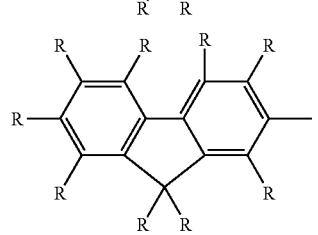

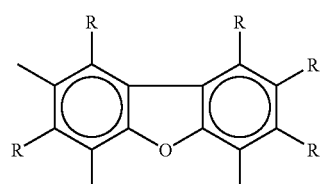

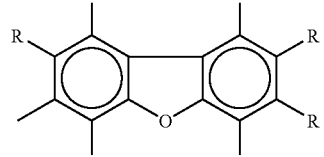

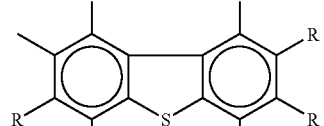

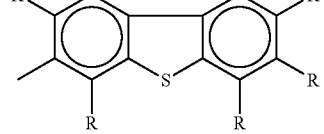

Here, as R, hydrogen atom, alkyl group, alkoxy group, alkylthio group, alkylsilyl group, alkylamino group, hydroxyl group, amino group, carboxyl group, aldehyde group, cyano group, etc. are exemplified. A plurality of R in one group of the above formula are contained, they may be the same or different from each other.

In order to improve the electron transporting property, the followings are preferable,

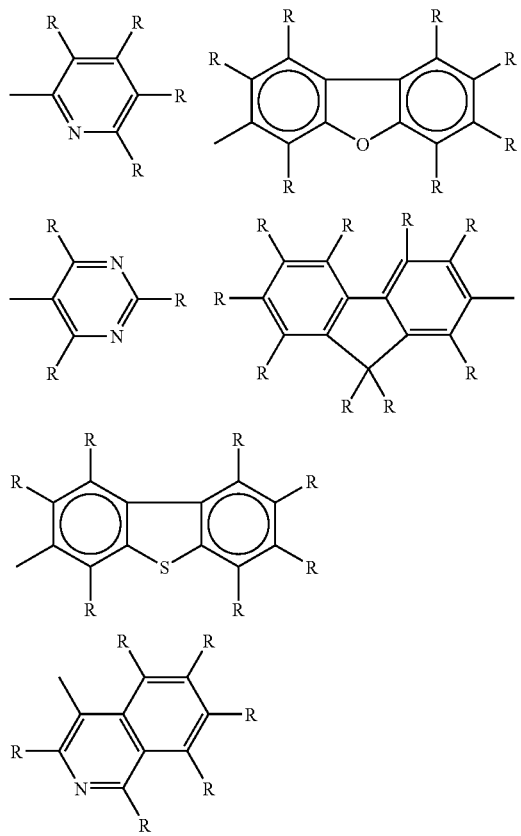

and the followings are more preferable.

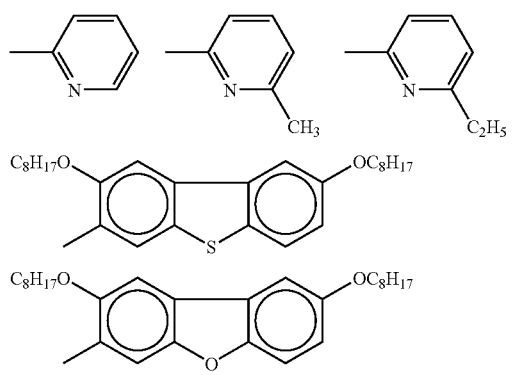

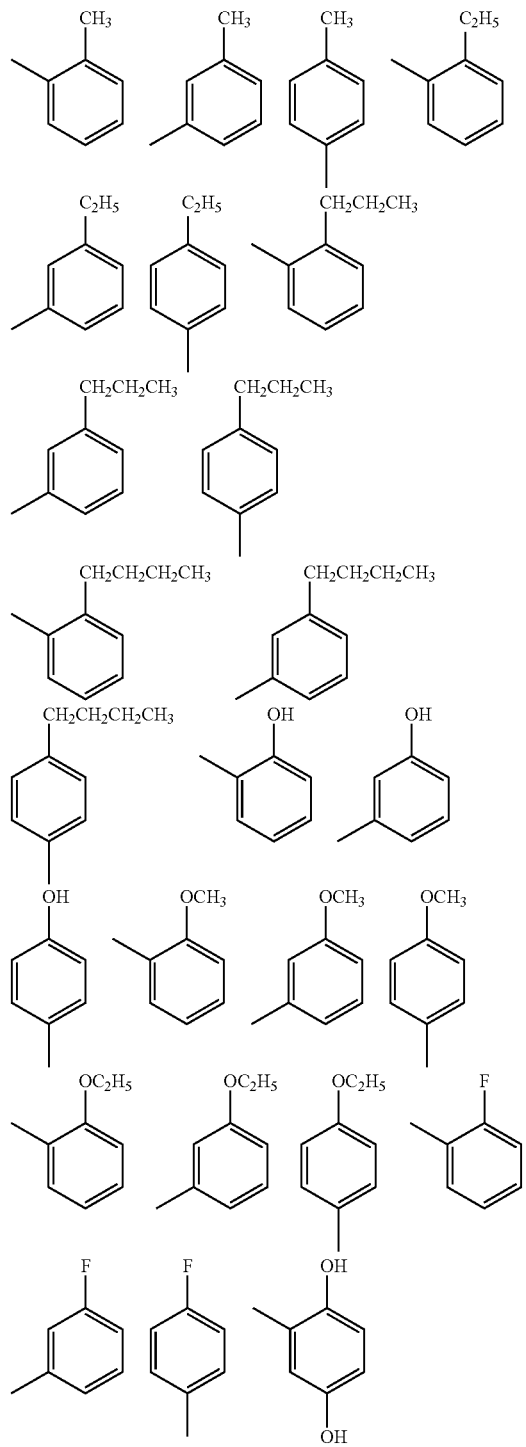

By using a naphthyl group, anthracenyl group or condensed-ring heterocyclic group as the aromatic end group, a light emitting property can be enhanced. Of them, an anthracenyl group, pyrenyl group and benzanthracenyl group are preferably used.

By using following groups as the aromatic end group, a mutual action between copolymers of the present invention, or compatibility or mutual action between the copolymer of the present invention and other kind of polymer compound can be enhanced.

By using a phenyl group carrying a substituted alkyl group having 6 or more carbon atoms as the aromatic end group, an anchor-like effect can be performed. The anchor effect means an effect by which an end group plays an anchor-like role on an aggregate of a polymer to enhance a mutual action.

In the copolymer of the present invention, at least one of molecular chain ends thereof may be advantageously composed of an aromatic end group selected from monovalent heterocyclic groups, monovalent groups derived from heterocyclic group coordinated metal complexes and aryl groups having a formula weight of 90 or more. This aromatic end group may be used singly or in combination of two or more. The content of the end groups other than the aromatic end group is preferably 30% or less, more preferably 20% or less, further preferably 10% or less, based on all end groups, and it is most preferable that such end groups do not substantially exist. Here, the molecular chain end means: an aromatic end group present at the end of a copolymer by the production method of the present invention; a leaving group of a monomer used for polymerization which remains intact at the end of a copolymer during polymerization; and a proton which is bonded instead of an aromatic end group where a leaving group of a monomer present at the end of a copolymer is removed. In producing a copolymer of the present invention, among these molecular chain ends which remains intact at the end of a copolymer during polymerization, for example, in case of using a monomer having a halogen atom as a raw material, a fluorescent property and the like tend to lower if a halogen remains at the end of a copolymer, therefore, it is preferable that a leaving group of a monomer does not substantially remain at its end.

The copolymer of the present invention has two or more kinds of repeating units selected from the group consisting of arylene group, divalent heterocyclic group, and divalent aromatic amine group.

When the copolymer of the present invention has two kinds of repeating units, in view of the solubility of copolymer, fluorescence strength, suppression of the luminance attenuation at the time of fabricating a device, easiness of the preparation etc., preferable are cases when: both of them are arylene groups; both of them are divalent heterocyclic groups; one is an arylene group and another is a divalent aromatic amine group; and one is a divalent heterocyclic group and another is divalent aromatic amine group. More preferable are cases when: one is an arylene group and another is a divalent aromatic amine group; and one is a divalent heterocyclic group and another is divalent aromatic amine group. The case when one is a divalent heterocyclic group and another is divalent aromatic amine group is further preferable.

When the copolymer of the present invention has three kinds of repeating units, in view of the solubility of copolymer, fluorescence strength, suppression of the luminance attenuation at the time of fabricating a device, easiness of the preparation etc., preferable are: a copolymer consisting of a kind of arylene group, and two kinds of divalent aromatic amines as repeating units; a copolymer consisting of two kinds of arylene groups, and a kind of divalent aromatic amine as repeating units; a copolymer consisting of two kinds of divalent heterocyclic groups, and a kind of divalent aromatic amine as repeating units; and a copolymer consisting of a kind of divalent heterocyclic group and two kinds of divalent aromatic amines as repeating units. Preferable is a copolymer consisting of a kind of divalent heterocyclic group and two kinds of divalent aromatic amines as repeating units.

As for the ratio of the repeating units contained in the copolymer of the present invention, in view of the fluorescence strength of copolymer, suppression of the luminance attenuation at the time of fabricating a device, etc., the ratio of the most contained repeating unit is preferably in the range of 60-95% by mole based on the total of all the repeating units, more preferably in the range of 65-90% by mole, and further preferably in the range of 70-80% by mole.

Here, the arylene group is as the above mentioned.

The divalent heterocyclic group means an atomic group in which two hydrogen atoms are removed from a heterocyclic compound, and the number of carbon atoms is usually about 4 to 60. The number of carbon atoms of the substituent is not counted as the number of carbon atoms of the divalent heterocyclic group.

The divalent heterocyclic group means an atomic group in which two hydrogen atoms are removed from a heterocyclic compound, and the number of carbon atoms is usually about 4 to 60. The number of carbon atoms of the substituent is not counted as the number of carbon atoms of the divalent heterocyclic group.

As the divalent heterocyclic groups, exemplified are: a divalent heterocyclic group containing nitrogen as a hetero atom; a divalent group having a fluorene structure containing silicon, nitrogen, oxygen, sulfur, selenium, etc. as a hetero atom; a divalent 5 membered-ring heterocyclic group containing nitrogen, oxygen, sulfur, silicon, selenium, etc. as a hetero atom; a divalent condensed-ring heterocyclic group having 5 membered or 6 membered-ring containing nitrogen, oxygen, sulfur, silicon, selenium, etc. as a hetero atom; a divalent group which is a 5 membered-ring heterocyclic groups containing silicon, nitrogen, sulfur, selenium, etc. as a hetero atom, which are connected at the a position of the hetero atom to form a dimer or an oligomer; and a divalent group which is a 5 membered-ring heterocyclic groups containing silicon, nitrogen, oxygen, sulfur, selenium, as a hetero atom, which are connected with a phenyl group at the a position of the hetero atom. As the concrete example of the divalent heterocyclic group, exemplified a group which is the concrete example of the monovalent heterocyclic group and any one of Rs thereof is served as a connecting bond.

Furthermore, the divalent aromatic amine group means an atomic group in which two hydrogen atom are removed from the aromatic ring of an aromatic amine. As the divalent aromatic amine group, for example, the group shown by formula (7) is exemplified.

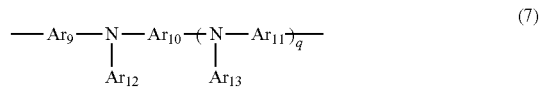

(7)

In the formula, $Ar_9$, $Ar_{10}$, and $Ar_{11}$, each independently represent an arylene group, and $Ar_{12}$ and $Ar_{13}$ each independently represent an aryl group. q represents an integer of 0 to 3. Concretely, exemplified a group which is the concrete example of the monovalent aromatic amine group wherein any one of Rs thereof is served as a connecting bond.

In addition, the copolymer of the present invention may contain a repeating unit other than the repeating Unit selected from the group consisting of arylene group, divalent heterocyclic group, and divalent aromatic amine group within a range of not injuring the fluorescence property or the charge transporting property.

In the copolymer of the present invention, the structure of the repeating unit may be the same with or different from the structure of the aromatic end group, but preferably they have different structures. In the copolymer of the present invention, either one of repeating unit selected from the group consisting of arylene group, divalent heterocyclic group, and divalent aromatic amine group bonds to an aromatic end group directly.

The copolymer of the present invention has a weight average molecular weight of $10^3$ to $10^8$ in terms of polystyrene, in view of film-forming property, it is preferably $1 \times 10^4$ to $5 \times 10^6$, more preferably $1 \times 10^5$ to $2 \times 10^6$, further preferably $2 \times 10^5$ to $1 \times 10^6$, and especially preferably $3 \times 10^5$ to $1 \times 10^6$.

As a good solvent to the copolymer of the present invention, chloroform, methylene chloride, dichloroethane, tetrahydrofuran, toluene, xylene, mesitylene and decalin, n-butylbenzene, etc. are exemplified. Although it depends also on the structure and the molecular weight of the copolymer, it is can be dissolved in the solvent, usually 0.1 wt % or more.

The copolymer of the present invention can be produced by: a method in which monomers corresponding to two or more kinds of repeating units are polymerized to obtain a copolymer having leaving groups at the terminal, and then this copolymer and a monomer corresponding to an aromatic end group are reacted; a method in which monomers corresponding to two or more kinds of repeating units are polymerized in the existence of a monomer corresponding to an aromatic end group, etc.

The copolymer of the present invention can be produced, for example, by reacting two or more monomers selected from formula (1), (2), and (3) and a monomer represented by formula (4) and/or (5).

$$Y_1-Ar_1-Y_2 \quad (1)$$

$$Y_3-Ar_2-Y_4 \quad (2)$$

$$Y_5-Ar_3-Y_6 \quad (3)$$

$$Y_7-E_1 \quad (4)$$

$$Y_8-E_2 \quad (5)$$

In the formula, $Ar_1$, $Ar_2$, and $Ar_3$ each independently represent an arylene group, divalent heterocyclic group, or divalent aromatic amine group. $E_1$ and $E_2$ each independently represent a monovalent heterocyclic group, a monovalent group derived from a heterocyclic group coordinated metal complex, or aryl group having a formula weight of 90 or more. $Y_1$, $Y_2$, $Y_3$, $Y_4$, $Y_5$, $Y_6$, $Y_7$, and $Y_8$ each independently represent a leaving group. However, $Ar_1$ differs from $Ar_2$ and $Ar_3$. Furthermore, $E_1$ and $E_2$ are mutually different from each other. When $Ar_2$ is the same with $Ar_3$, at least one of the leaving group ($Y_3$, $Y_4$) of $Ar_2$ differs from at least one of the leaving group ($Y_5$, $Y_6$) of $Ar_3$.

As the leaving group, halogen atom, alkylsulfonyloxy group, arylsulfonyloxy group, or the group shown by —B(OR$_{11}$)$_2$ (here, R$_{11}$ is hydrogen atom or alkyl group) is exemplified.

Here, as the halogen atom, chlorine atom, bromine atom, and iodine atom are exemplified, chlorine atom and bromine atom are preferable, and bromine atom is the most preferable. The alkylsulfonyloxy group may be Substituted by fluorine atom, and trifluoro methane sulfonyloxy group, etc. are exemplified. The arylsulfonyloxy group may be substituted by an alkyl group, and phenylsulfonyloxy group, trisulfonyloxy group, etc. are exemplified.

In a group represented by —B(OR$_{11}$)$_2$, R$_{11}$ is hydrogen atom or alkyl group. As the alkyl group, number of carbon atoms is usually about 1 to 20, methyl group, ethyl group, propyl group, butyl group, hexyl group, octyl group, dodecyl group, etc. are exemplified. The alkyl groups are connected themselves and they may form a ring.

As a group represented by —B(OR$_{11}$)$_2$, concrete examples are

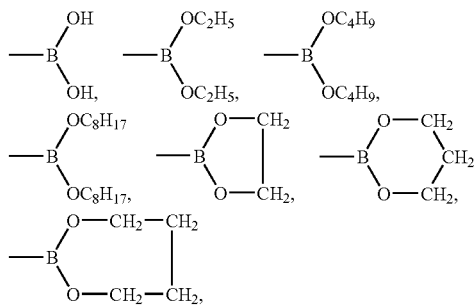

and preferably

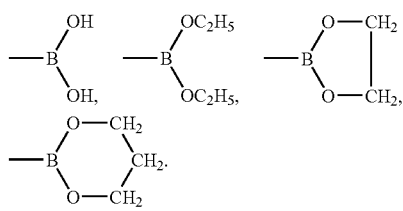

Total charging amount of monomers represented by formulae (4) and (5) is usually 0.1-10% by mole based on the total charging amount of monomers represented by formulae (1), (2), (3), (4) and (5), preferably 0.2-5% by mole, and more preferably 0.5-3% by mole.

As the method for producing the copolymer of the present invention, exemplified are: a polymerizing method of a corresponding monomer above by Suzuki reaction(Chemical Review (Chem Rev.), volume 95, page 2457 (1995)); a polymerizing method by Grignard reaction (published by Kyoritsu-Shuppan, series of Polymer Functional Materials Volume 2, Synthesis and Reaction of Polymers (2), pages 432-3)); a polymerizing method by Yamamoto reaction (Progressive Polymer Science (Prog. Polym. Sci.), volume 17, pages 1153-1205 (1992); and a polymerizing method by an oxidizing agent such as FeCl$_3$ (Published by Maruzen, Jikken Kagaku Koza, 4th Edition, volume 28, page 339-340).

The case of using the Suzuki reaction is explained. In this case, monomers are used in which $Y_1$ and $Y_2$ are each independently a group represented by —B(OR$_{11}$)$_2$ (here, R$_{11}$ is hydrogen atom or alkyl group); $Y_3$ and $Y_4$ are each independently halogen atom, alkylsulfonyloxy group, or arylsulfonyloxy group; and $Y_5$ and $Y_6$ are each independently a group represented by —B(OR$_{11}$)$_2$ (here, R$_{11}$ is hydrogen atom or alkyl group), or each independently halogen atom, alkylsulfonyloxy group, or arylsulfonyloxy group; and $Y_7$ is a group represented by —B(OR$_{11}$)$_2$, (here, R$_{11}$ is hydrogen atom or alkyl group); and $Y_8$ is halogen atom, alkylsulfonyloxy group, or arylsulfonyloxy group: and can be prepared by reacting in existence of Pd(0) catalyst.

In case of the reaction wherein at least one is a monomer having two —B(OR$_{11}$)$_2$ (R$_{11}$ is hydrogen atom or alkyl group), and at least one is a monomer having two halogen atoms, two alkylsulfonyloxy groups or two arylsulfonyloxy groups are necessary to be used, as two or more monomers having two leaving groups used for the reaction, usually, after reacting a monomers represented by formula (1) to (3) about 1 to 100 hours, monomer (5) is added thereto to react for about 0.5 to 50 hours, and then monomer (4) is added to react for about 0.5 to 50 hours.

As Pd(0) catalyst, for example, palladium [tetrakis (triphenylphosphine)], palladium acetate etc., is used, and inorganic base, such as potassium carbonate, sodium carbonate, and barium hydroxide; organic base such as triethylamine; or inorganic salt such as cesium fluoride, is added in an equivalent amount or more to the monomers, preferably 1 to 10 equivalent, and reacted.

The reaction may be carried out by two-phase system, using inorganic salt as an aqueous solution. As a solvent, N,N-dimethylformamide, toluene, dimethoxyethane, tetrahydorofuran, etc. are exemplified. Although it depends also on a solvent, temperature of about 50-160° C. is preferably used. The temperature may be raised to near the boiling point of a solvent and refluxed. Reaction time is about from 1 hour to 200 hours. The case of using a Yamamoto polymerizing method is explained. In this case, monomers are used in which $Y_1$, $Y_2$, $Y_3$, $Y_4$, $Y_5$, $Y_6$, $Y_7$ and $Y_8$ are each independently halogen atom, alkylsulfonyloxy group or arylsulfonyloxy group, and can be prepared by reacting these monomers in existence of nickel(0) complex. The reaction is usually carried out by mixing all monomers (1)-(5).

As the nickel complex, in using nickel (0) complex (zero-valent nickel complex), there are a method using zero-valent nickel itself, and a method of reacting a nickel salt in existence of a reduction agent to produce a zero-valent nickel in the system, and used.

As the zero-valent nickel complex, bis(1,5-cyclooctadiene) nickel(0), (ethylene)bis(triphenylphosphine)nickel(0), tetrakis(triphenylphosphine)nickel etc. are exemplified, and among them, bis(1,5-cyclooctadiene)nickel(0) is preferable in view of versatility and cheapness. Moreover, it is preferable to add a neutral ligand in view of yield improvement. Here, the neutral ligand means a ligand having neither anion nor cation. Exemplified are: nitrogen containing ligands such as 2,2'-bipyridyl, 1,10-phenanthroline, methylenebisoxazoline, N,N'-tetramethylethylenediamine, etc.; and tertiary phosphine ligands such as triphenylphosphines, tritolylphosphine, tributylphosphine, triphenoxyphosphine, etc. Nitrogen containing ligands are preferable in view of versatility and cheapness, and 2,2'-bipyridyl is especially preferable in view of high reactivity and high yield. Especially, in view of improvement of polymer yield, preferable is a system wherein 2,2'-bipyridyl is added as a neutral ligand to a system containing bis(1,5-cyclooctadiene)nickel(0). In the method of reacting zero-valent nickel in a system, nickel chloride, acetic-acid nickel, etc. are exemplified as the nickel salt. As the reduction agent, zinc, sodium hydride, hydrazine and its derivatives, lithium aluminum hydride, etc. are exemplified, and according to requirements, ammonium iodide, lithium iodide, potassium iodide, etc. are used as the additive.

As the polymerization solvent, it is not especially limited so long as the polymerization is not inhibited, and those containing one or more kinds of aromatic hydrocarbon solvents and/or ether solvents are preferable.

As the aromatic hydrocarbon solvent, for example, benzene, toluene, xylene, trimethylbenzene, tetramethylbenzene, butylbenzene, naphthalene, tetralin, etc. are exemplified, and toluene, xylene, tetralin, and tetramethylbenzene are preferable. As the ether solvent, for example, diisopropylether, tetrahydorofuranl and 1,4-dioxane, diphenylether, ethyleneglycoldimethyl ether, tert-butylmethylether, etc. are exemplified, and tetrahydorofuran 1,4-dioxane etc. which are good solvents to a polymer compound, are preferable. Among the solvents, tetrahydorofuran is the most preferable.

In view of improving polymerization property and solubility, as the solvent, a mixed solvent aromatic of a hydrocarbon solvent and/or an ether solvent with a solvent other than the aromatic hydrocarbon solvent and the ether solvent, as long as it does not inhibit the polymerization reaction.

Reaction procedure, etc. can be carried out, for example, according to the method described in JP-A No. 2000-44544. In the Yamamoto polymerizing method, a polymerization reaction is carried out usually in inert-gas atmosphere, such as argon and nitrogen, in tetrahydorofuran solvent, at a temperature of 60° C., and in existence of a zero-valent nickel complex and a neutral ligand. Polymerization time is usually about 0.5-100 hours, preferably it is 10 hours or less in view of the production cost.

The polymerization temperature is usually about 0-200° C. and preferably 20-100° C. in view of high yield and low heating cost.

Moreover, in case where a neutral ligand is used, as the using amount, it is preferably about 0.5-10 mols based on one mol of the zero-valent nickel complexes, more preferably 0.8~1.5 mols, and further preferably 0.9-1.1 mols, in view of reaction yield and cost.

The amount of zero-valent nickel complex is not especially limited as long as the polymerization reaction is not inhibited, but when it is too little, the molecular weight becomes lower, and when the amount is too large, the post-treatment tends to become complicated. Therefore, it is preferably 0.1-10 mols based on one mol of monomer, more preferably 1-5 mols, and further preferably 2-3.5 mols.

When the copolymer of the present invention is used as a light-emitting material of a polymer LED, the purity thereof exerts an influence on the light emitting property, therefore, it is preferable that a monomer is purified by a method such as distillation, sublimation purification, re-crystallization and the like before being polymerized. Furthermore, after the production, it is preferable to conduct a purification operation of reprecipitation purification, and column chromatography separation.

The polymer composition of the present invention has fluorescence in the solid state, and contains a polymer compound whose polystyrene-reduced number average molecular weight of $10^3$-$10^8$, and the above-mentioned copolymer. The polymer compound will not be especially limited as long as it improves the solubility in a solvent, and the characteristic of devices, such as, fluorescencestrength, lifetime, luminance, etc. Concretely, polymer compounds described in JP-A No. 2001-247861, JP-A No. 2001-507511, JP-A No. 2001-504533, JP-A No. 2001-278958, JP-A No. 2001-261796, JP-A No. 2001-226469, and Japanese patent No. 3161058, are exemplified, without being limited thereto. As the kinds of polymer compounds, polyfluorene type compound, polyfluorene type copolymer, polyarylene type compound, polyarylene type copolymer, polyarylenevinylene type compound, polyarylenevinylene type copolymer, poly stilbene type compound, polystilbene type copolymer, poly stilbenevinylene type compound, polystilbenevinylene type copolymer, polypyridinediyl type compound, polypyridinediyl type copolymer, alkoxy polythiophen type compound, alkoxy polythiophen type copolymer, etc. are exemplified, without being limited thereto. Among them, polyfluorene type copolymer, polyarylene type copolymer, polyarylenevinylene type copolymer, poly stilbene type copolymer, and poly stilbenevinylenecopolymer are preferable. The mixing ratio is not limited as long as it improves the solubility in a solvent, and the characteristic of devices, such as, fluorescence strength, life time, luminance, etc. The ratio of the copolymer of the present invention is usually in a rage of 5-95% by weight based on the whole polymer composition, preferably in a rage of 40-95% by weight, more preferably in a rage of 50-80% by weight, and further preferably 65-75% by weight. Moreover, it is also preferable that the ratio of a polymer compound other than the copolymer of the present invention is in a range of 50-80% by weight based on the whole polymer composition, and more preferable is that in a range of 65-75% by weight.

As the polymer composition of the present invention, those containing two or more kinds of copolymers having aromatic terminal group of the present invention is exemplified. As the copolymer having aromatic terminal group, among polyfluorene type copolymer, polyarylene type copolymer, polyarylenevinylene type copolymer, polystilbene type copolymer, polystilbenevinylene type copolymer, poly pyridinediyl type copolymer, alkoxy polythiophen type copolymer, etc., those polymer compounds having aromatic terminal group are exemplified. The polymer composition of the present invention is preferably obtained by combining the two or more of these copolymers. Moreover, the compounding ratio is not especially limited, and it is also preferable that the ratio of copolymer contained the most in a composition is in a range of 50-80% by weight based on the whole polymer composition, and those in a range of 65-75% by weight is more preferable.

The polymer LED of the present invention has a light emitting layer between the electrodes consisting of an anode and a cathode, and this light emitting layer contains the copolymer or the polymer composition of the present invention. The polymer LED of the present invention include: a polymer light emitting device, wherein, between at least one electrode and the light emitting layer, a layer containing a conductive polymer is provided adjacent to the electrode; and a polymer light emitting device, wherein, between at least one electrode and the light emitting layer, an insulation layer having an average film thickness of 2 nm or less is provided adjacent to the electrode.

Moreover, the polymer LED of the present invention also include: a polymer light emitting device, wherein, between the cathode and the light emitting layer, an electron transporting layer is provided adjacent to the light emitting layer; a polymer light emitting device, wherein, between the cathode and the light emitting layer, a hole transporting layer is provided adjacent to the light emitting layer; and a polymer light emitting device, wherein, between the cathode and the light emitting layer, an electron transporting layer is provided adjacent to the light emitting layer, and between the anode and the light emitting layer, a hole transporting layer is provided adjacent to the light emitting layer.

As the structures of the polymer LED of the present invention, for example, the following structures a) to d) are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode
(wherein, "/" indicates adjacent lamination of layers. Hereinafter, the same).

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer. The light emitting layer, hole transporting layer and electron transporting layer also may be used each independently in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode; and further, for enhancing adherence of the interface, preventing mixing and the like, a thin buffer layer may also be inserted into the interface of a charge transporting layer and light emitting layer. The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode. For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less. Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified. The thickness of the charge injecting layer is, for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In the light emitting layer, the copolymer or the polymer composition of the present invention is contained, and light emitting materials other than the above copolymer can also be mixed. Further, in the polymer LED of the present invention, the light emitting layer containing light emitting materials other than the above copolymer may also be laminated with a light emitting layer containing the above copolymer.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like. Specifically, there can be used known compounds such as those described in JP-A Nos. 57-51781, 59-195393 and the like, for example.

The film forming method of light-emitting layer is not especially limited, a film forming method from a solution is exemplified.

Examples of the film forming method from a solution include coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

As the solvent used for a film forming method from a solution, toluene xylene, chloroform and tetrahydrofuran are exemplified.

Regarding the thickness of the light emitting layer, the optimum value differs depending on material used, and may properly be selected so that the driving voltage and the light emitting efficiency become optimum values, and for example, it is from 1 nm to 1 μm, preferably from 2 nm to 500 nm, further preferably from 5 nm to 200 nm.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pinhole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly limited, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively. In the film-forming from a solution or melted state, a polymer binder can be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

Usually, at least one of the electrodes consisting of an anode and a cathode, is transparent or semitransparent. It is preferable that the anode is transparent or semitransparent. As the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium/tin/oxide (ITO), indium/zinc/oxide and the like, which are metal oxide complexes, and gold, platinum, silver, copper and the like are used, and among them, ITO, indium/zinc/oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like. The thickness of the anode can be appropriately selected while considering transmission of a light and electric conductivity, and for example, from 10 nm to 10 μm, preferably from 20 nm to 1 μm, further preferably from 50 nm to 500 nm. Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers. The thickness of the cathode can be appropriately selected while considering transmission of a light and electric conductivity, and for example, from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymeric compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

The polymer LED of the present invention can be used for a flat light source, a segment display, a dot matrix display, and a liquid crystal display as a back light, etc.

For obtaining light emission in plane form using the polymer LED of the present invention, an anode and a cathode in the plane form may properly be placed so that they are laminated each other. Further, for obtaining light emission in pattern form, there is a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric compounds emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

Moreover, the copolymer of the present invention can be used also as a coloring matter for lasers, a material for organic solar-cell, an organic transistor for organic semiconductor, and a conductive thin film material.

Examples will be shown below for explaining the present invention further in detail, but do not limit the scope of the present invention.

Here, regarding molecular weight, polystyrene-reduced number-average molecular weight and weight-average molecular weight were measured by gel permeation chromatography (GPC) using chloroform as a solvent.

Synthesis Example 1

Synthesis of Compound A

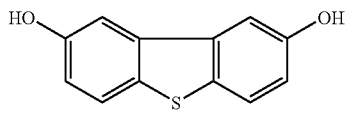
compound A

Into a 1 L four-necked flask were charged 7 g of 2,8-dibromodibenzothiophene and 280 ml of THF under an inert atmosphere, these were stirred at room temperature to be dissolved, then, cooled down to −78° C. 29 ml (1.6 mol hexane solution) of n-butyllithium was added dropwise on this. After completion of adding, the solution was stirred for 2 hours while maintaining the temperature, and 13 g of trimethoxyboronic acid was added dropwise on this. After completion of adding, the temperature was returned slowly to room temperature. The solution was stirred at room temperature for 3 hours, then, disappearance of raw materials was confirmed by TLC. 100 ml of 5% sulfuric acid was added to complete the reaction, and the solution was stirred for 12 hours at room temperature. Water was added for washing, and the organic layer was extracted. The solvent was replaced with ethyl acetate, then, 5 ml of 30% hydrogen peroxide was added, and the solution was stirred for 5 hours at 40%. Then, the organic layer was extracted, washed with a 10% ammonium iron (II) sulfate aqueous solution, then, dried, and the solvent was removed, to obtain 4.43 g of brown solid. According to LC-MS measurement, by products such as a dimer and the like were produced and the purity of compound A was 77% (LC area percentage).

MS (APCI(−)): (M−H)$^-$215

Synthesis Example 2

Synthesis of Compound B

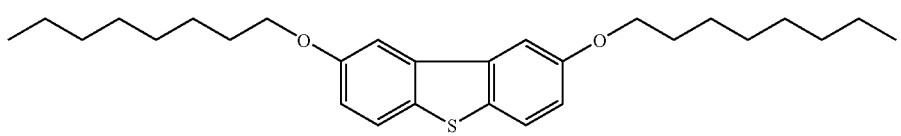
compound B

Into a 200 ml three-necked flask were charged 4.43 g of compound A, 25.1 g of n-octyl bromide and 12.5 g (23.5 mmol) of potassium carbonate under an inert atmosphere, and 50 ml of methyl isobutyl ketone was added as a solvent and the solution was heated under reflux for 6 hours at 125° C. After completion of the reaction, the solvent was removed, the residual portion was partitioned between chloroform and water, and the organic layer was extracted, and further washed with water twice. The resulted solution was dried over anhydrous sodium sulfate, then, purified through a silica gel column (developing solvent: toluene/cyclohexane=1/10) to obtain 8.49 g of compound B (LC area percentage 97%, yield 94%).

$^1$H-NMR (300 MHz/CDCl$_3$):

δ 0.91 (t, 6H, 1.31 to 1.90 (m, 24H), 4.08 (t, 4H), 7.07 (dd, 2H), 7.55 (d, 2H), 7.68 (d, 2H)

Synthesis Example 3

Synthesis of Compound C

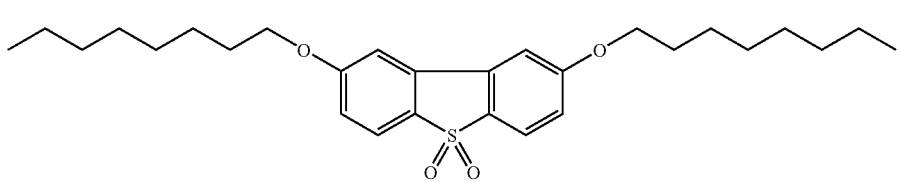
compound C

Into a 100 ml three-necked flask were charged 6.67 g of compound B and 40 ml of acetic acid, and the oil bath was heated up to a bath temperature of 140%. Subsequently, 13 ml of 30% hydrogen peroxide was added from a cooling tube, the solution was stirred vigorously for 1 hour, then, poured into 180 ml of cold water to complete the reaction. The solution was extracted with chloroform, dried, then, the solvent was removed to obtain 6.96 g of compound C (LC area percentage 90%, yield 97%).

$^1$H-NMR (300 MHz/CDCl$_3$):

δ 0.90 (t, 6H), 1.26 to 1.87 (m, 24H), 4.06 (t, 4H), 7.19 (dd, 2H), 7.69 (d, 2H), 7.84 (d, 2H)

MS (APCI(+)): (M+H)$^+$473

Synthesis Example 4

Synthesis of Compound D

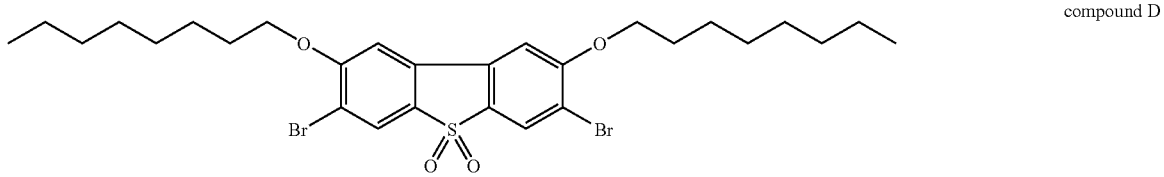 [SMILES: CCCCCCCCOc1cc2c(cc1Br)S(=O)(=O)c1cc(Br)c(OCCCCCCCC)cc1-2]

compound D

Into a 200 ml four-necked flask were charged 3.96 g of compound C and 15 ml of mixed liquid of acetic acid/chloroform=1:1 under an inert atmosphere, and the mixture was stirred at 70° C. to be dissolved. Subsequently, 6.02 g of bromine was dissolved in 3 ml of the above-mentioned solvent and added, and the solution was stirred for 3 hours. A sodium thiosulfate aqueous solution was added to remove unreacted bromine, the resulted solution was partitioned between chloroform and water, the organic layer was extracted, and dried. The solvent was removed, and the residue was purified through a silica gel column (developing solvent: chloroform/hexane=¼) to obtain 4.46 g of compound D (LC area percentage 98%, yield 84%).

$^1$H-NMR (300 MHz/CDCl$_3$):

δ 0.95 (t, 6H), 1.30 to 1.99 (m, 24H), 4.19 (t, 4H), 7.04 (s, 2H), 7.89 (s, 2H)

MS (FD$^+$) M$^+$630

Synthesis Example 5

Synthesis of Compound E

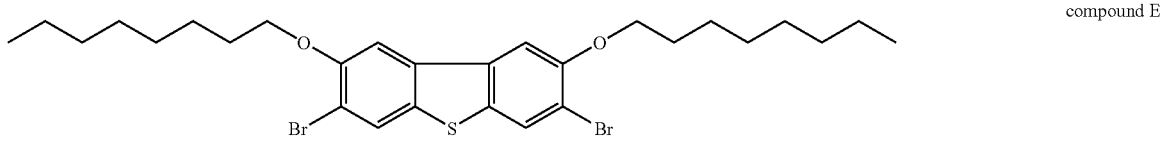 [SMILES: CCCCCCCCOc1cc2c(cc1Br)sc1cc(Br)c(OCCCCCCCC)cc12]

compound E

Into a 200 ml three-necked flask were charged 3.9 g of compound D and 50 ml of diethyl ether under an inert atmosphere, and the mixture was heated up to 40° C. and stirred. 1.17 g of lithium aluminum hydride was added portion-wise, and they were reacted for 5 hours. Excess lithium aluminum hydride was decomposed by adding water portion-wise, and the solution was washed with 5.7 ml of 36% hydrochloric acid. The residual portion was partitioned between chloroform and water, the organic layer was extracted, then, dried. The residue was purified through a silica gel column (developing solvent: chloroform/hexane=1/5) to obtain 1.8 g of compound E (LC area percentage 99%, yield 49%).

H-NMR (300 MHz/CDCl$_3$):

δ 0.90 (t, 6H), 1.26 to 1.97 (m, 24H), 4.15 (t, 4H), 7.45 (s, 2H), 7.94 (s, 2H)

MS (FD$^+$) M$^+$598

According to the MS (APCI(+)) method, peaks were detected at 615 and 598.

Example 1

Synthesis of Copolymer 1

0.36 g (0.60 mmol) of compound E, 0.17 g (0.25 mmol) of N,N'-bis(4-bromophenyl)-N,N'-bis(4-n-butylphenyl) 1,4-phenylenediamine, 6.8 mg (0.040 mmol) of p-bromotoluene and 0.34 g (2.2 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 0.6 g (2.2 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 10 ml of 25% aqueous ammonia, 120 ml of methanol and 50 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 30 mL of toluene, and 30 mL of 1 N hydrochloric acid was added to this and the mixture was stirred for 1 hour, the aqueous layer was removed and 30 mL of 4% aqueous ammonia was added to the organic layer, and the mixture was stirred for 1 hour, then, the aqueous layer was removed. 200 mL of methanol was added dropwise into the organic layer and the mixture was stirred for 1 hour, the deposited precipitate was filtrated and dried under reduced pressure for 2 hours, and dissolved in 30 mL of toluene. Thereafter, the solution was passed through an alumina column (alumina amount: 20 g) for purification, and the recovered toluene solution was added dropwise into 250 mL of methanol and the mixture was stirred for 1 hour, and the deposited precipitate was filtrated and dried under reduced pressure for 2 hours. The yield of the resulted copolymer 1 was 0.11 g. Copolymer 1 had a polystyrene-reduced number-average molecular weight of $4.1\times10^4$, and a polystyrene-reduced weight-average molecular weight of $6.4\times10^4$.

Synthesis Example 6

Synthesis of Copolymer 2

2,7-dibromo-9,9-dioctylfluorene (26 g, 0.047 mol), 2,7-dibromo-9,9-diisopentylfluorene (5.6 g, 0.012 mol) and 2,2'-bipyridyl (22 g, 0.141 mol) were dissolved in 1600 mL of dehydrated tetrahydrofuran, then, an atmosphere in the system was purged with nitrogen by bubbling with nitrogen. Under a nitrogen atmosphere, to this solution was added bis(1,5-cyclooctadiene) nickel (0) {Ni(COD)$_2$} (40 g, 0.15 mol) and the solution was heated up to 60° C. and reacted for 8 hours. After the reaction, this reaction liquid was cooled down to room temperature (about 25° C.), and added dropwise into a mixed solution of 200 ml of 25% aqueous ammonia, 1200 ml of methanol and 1200 ml of ion exchanged water, and the mixture was stirred for 30 minutes, then, the deposited precipitate was filtrated and dried in air. Then, the dried precipitate was dissolved in 1100 mL of toluene, then, filtrated and the filtrate was added dropwise into 3300 mL of methanol and the mixture was stirred for 30 minutes. The deposited precipitate was filtrated, and washed with 1000 mL of methanol, then, dried under reduced pressure for 5 hours. The yield of the resulted copolymer 2 was 20 g. Copolymer 2 had a polystyrene-reduced Mn of $4.6\times10^4$, and a polystyrene-reduced Mw of $1.1\times10^5$.

Example 2

<Measurement of Luminance>

On a glass base plate carrying an ITO film having a thickness of 150 nm provided by a sputtering method, a film having a thickness of 50 nm was formed by spin coat using a solution of poly(ethylenedioxythiophene)/polystyrenesulfonic acid (Baytron P, manufactured by Bayern), and dried on a hot plate at 200° C. for 10 minutes. Next, a film was formed by spin coat at a revolution of 1500 rpm using a toluene solution so produced that the content of a mixture of copolymer 1 and copolymer 2 (=3:7 ratio by weight) was 1.5 wt %. Further, this was dried under reduced pressure at 80° C. for 1 hour, then, lithium fluoride was vapor-deposited at a film thickness of about 4 nm, and as a cathode, calcium was vapor-deposited at a film thickness of about 20 nm, then, aluminum was vapor-deposited at a film thickness of about 50 nm, to produced an EL device. After the degree of vacuum reached to $1\times10^{-4}$ Pa or less, vapor-deposition of metals was initiated. By applying voltage on the resulted device, EL light emission was obtained showing a peak at 468 nm. The device showed light emission of 100 cd/m$^2$ at about 5.1 V. When the initial luminance was set at 100 cd/m$^2$ and attenuation of luminance was measured, then, time for 20% reduction in luminance was 130 hours.

Example 3

Synthesis of Copolymer 3

0.35 g (0.58 mmol) of compound E, 0.17 g (0.25 mmol) of N,N'-bis(4-bromophenyl)-N,N'-bis(4-n-butylphenyl) 1,4-phenylenediamine, 0.014 g (0.042 mmol) of N-(4-bromophenyl)-N,N-diphenylamine and 0.34 g (2.2 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 0.6 g (2.2 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 10 ml of 25% aqueous ammonia, 120 ml of methanol and 50 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 30 mL of toluene, and 30 mL of 1 N hydrochloric acid was added to this and the mixture was stirred for 1 hour, the aqueous layer was removed and 30 mL of 4% aqueous ammonia was added to the organic layer, and the mixture was stirred for 1 hour, then, the aqueous layer was removed. 200 mL of methanol was added dropwise into the organic layer and the mixture was stirred for 1 hour, the deposited precipitate was filtrated and dried under reduced pressure for 2 hours, and dissolved in 30 mL of toluene. Thereafter, the solution was passed through an alumina column (alumina amount: 20 g) for purification, and the recovered toluene solution was added dropwise into 250 mL of methanol and the mixture was stirred for 1 hour, and the deposited precipitate was filtrated and dried under reduced pressure for 2 hours. The yield of the resulted copolymer 3 was 0.023 g. Copolymer 3 had a polystyrene-reduced number-average molecular weight of $2.2\times10^4$, and a polystyrene-reduced weight-average molecular weight of $3.5\times10^4$.

Example 4

<Measurement of Luminance>

A device was produced in the same manner as in Example 2, except that copolymer 3 was used instead of copolymer 1. Film formation was conducted by spin coat at 1200 rpm. EL light emission was obtained showing a peak at 464 nm by applying voltage on the resulted device. The device showed light emission of 100 cd/m$^2$ at about 5.2 V. When the initial luminance was set at 100 cd/m$^2$ and attenuation of luminance was measured, then, time for 20% reduction in luminance was 150 hours.

Example 5

Synthesis of Copolymer 4

0.30 g (0.50 mmol) of compound E, 0.15 g (0.21 mmol) of N,N'-bis(4-bromophenyl)-N,N'-bis(4-n-butylphenyl) 1,4-phenylenediamine, 0.004 g (0.021 mmol) of 2-bromothiophene and 0.29 g (1.8 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 0.51 g (1.8 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 10 ml of 25% aqueous ammonia, 120 ml of methanol and 50 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 30 mL of toluene, and 30 mL of 1 N hydrochloric acid was added to this and the mixture was stirred for 1 hour, the aqueous layer was removed and 30 mL of 4% aqueous ammonia was added to the organic layer, and the mixture was stirred for 1 hour, then, the aqueous layer was removed. 200 mL of methanol was added dropwise into the organic layer and the mixture was stirred for 1 hour, the deposited precipitate was filtrated and dried under reduced pressure for 2 hours, and dissolved in 30 mL of toluene. Thereafter, the solution was passed through an alumina column (alumina amount: 20 g) for purification, and the recovered toluene solution was added dropwise into 250 mL of methanol and the mixture was stirred for 1 hour, and the deposited precipitate was filtrated and dried under reduced pressure for 2 hours. The yield of the resulted copolymer 4 was 0.18 g. Copolymer 4 had a polystyrene-reduced number-average molecular weight of $2.8 \times 10^4$, and a polystyrene-reduced weight-average molecular weight of $6.1 \times 10^4$.

Example 6

<Measurement of Luminance>

A device was produced in the same manner as in Example 2, except that copolymer 4 was used instead of copolymer 1. Film formation was conducted by spin coat at 1300 rpm. EL light emission was obtained showing a peak at 464 nm by applying voltage on the resulted device. The device showed light emission of 100 cd/m$^2$ at about 4.7 V. When the initial luminance was set at 100 cd/m$^2$ and attenuation of luminance was measured, then, time for 20% reduction in luminance was 85 hours.

Example 7

Synthesis of Copolymer 5

0.30 g (0.50 mmol) of compound E, 0.15 g (0.21 mmol) of N,N'-bis(4-bromophenyl)-N,N'-bis(4-n-butylphenyl) 1,4-phenylenediamine, 0.003 g (0.014 mmol) of 2-bromo-5-ethylthiophene and 0.29 g (1.8 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 0.51 g (1.8 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 10 ml of 25% aqueous ammonia, 120 ml of methanol and 50 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 30 mL of toluene, and 30 mL of 1 N hydrochloric acid was added to this and the mixture was stirred for 1 hour, the aqueous layer was removed and 30 mL of 4% aqueous ammonia was added to the organic layer, and the mixture was stirred for 1 hour, then, the aqueous layer was removed. 200 mL of methanol was added dropwise into the organic layer and the mixture was stirred for 1 hour, the deposited precipitate was filtrated and dried under reduced pressure for 2 hours, and dissolved in 30 mL of toluene. Thereafter, the solution was passed through an alumina column (alumina amount: 20 g) for purification, and the recovered toluene solution was added dropwise into 250 mL of methanol and the mixture was stirred for 1 hour, and the deposited precipitate was filtrated and dried under reduced pressure for 2 hours. The yield of the resulted copolymer 5 was 0.066 g. Copolymer 5 had a polystyrene-reduced number-average molecular weight of $3.6 \times 10^4$, and a polystyrene-reduced weight-average molecular weight of $1.1 \times 10^5$.

Example 8

<Measurement of Luminance>

A device was produced in the same manner as in Example 2, except that copolymer 5 was used instead of copolymer 1. Film formation was conducted by spin coat at 1500 rpm. EL light emission was obtained showing a peak at 460 nm by applying voltage on the resulted device. The device showed light emission of 100 cd/m$^2$ at about 4.3 V. When the initial luminance was set at 100 cd/m$^2$ and attenuation of luminance was measured, then, time for 20% reduction in luminance was 155 hours.

Example 9

Synthesis of Copolymer 6

0.30 g (0.50 mmol) of compound E, 0.15 g (0.21 mmol) of N,N'-bis(4-bromophenyl)-N,N'-bis(4-n-butylphenyl) 1,4-phenylenediamine, 0.003 g (0.014 mmol) of 2-bromopyridine and 0.29 g (1.8 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 0.51 g (1.8 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 10 ml of 25% aqueous ammonia, 120 ml of methanol and 50 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 30 mL of toluene, and 30 mL of 1 N hydrochloric acid was added to this and the mixture was stirred for 1 hour, the aqueous layer was removed and 30 mL of 4% aqueous ammonia was added to the organic layer, and the mixture was stirred for 1 hour, then, the aqueous layer was removed. 200 mL of methanol was added dropwise into the organic layer and the mixture was stirred for 1 hour, the deposited precipitate was filtrated and dried under reduced pressure for 2 hours, and dissolved in 30 mL of toluene. Thereafter, the solution was passed through an alumina column (alumina amount: 20 g) for purification, and the recovered toluene solution was added dropwise into 250 mL of methanol and the mixture was stirred for 1 hour, and the deposited precipitate was filtrated and dried under reduced pressure for 2 hours. The yield of the resulted copolymer 6 was 0.19 g. Copolymer 6 had a polystyrene-reduced number-average molecular weight of $2.7 \times 10^4$, and a polystyrene-reduced weight-average molecular weight of $7.4 \times 10^4$.

Example 10

<Measurement of Luminance>

A device was produced in the same manner as in Example 2, except that copolymer 6 was used instead of copolymer 1. Film formation was conducted by spin coat at 1300 rpm. EL light emission was obtained showing a peak at 468 nm by applying voltage on the resulted device. The device showed light emission of 100 cd/m$^2$ at about 4.7 V. When the initial luminance was set at 100 cd/m² and attenuation of luminance was measured, then, time for 20% reduction in luminance was 55 hours.

Example 11

Synthesis of Copolymer 7

0.30 g (0.50 mmol) of compound E, 0.15 g (0.21 mmol) of N,N'-bis(4-bromophenyl)-N,N'-bis(4-n-butylphenyl) 1,4-phenylenediamine, 0.007 g (0.014 mmol) of compound F and 0.29 g (1.8 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 0.51 g (1.8 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 10 ml of 25% aqueous ammonia, 120 ml of methanol and 50 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 30 mL of toluene, and 30 mL of 1 N hydrochloric acid was added to this and the mixture was stirred for 1 hour, the aqueous layer was removed and 30 mL of 4% aqueous ammonia was added to the organic layer, and the mixture was stirred for 1 hour, then, the aqueous layer was removed. 200 mL of methanol was added dropwise into the organic layer and the mixture was stirred for 1 hour, the deposited precipitate was filtrated and dried under reduced pressure for 2 hours, and dissolved in 30 mL of toluene. Thereafter, the solution was passed through an alumina column (alumina amount: 20 g) for purification, and the recovered toluene solution was added dropwise into 250 mL of methanol and the mixture was stirred for 1 hour, and the deposited precipitate was filtrated and dried under reduced pressure for 2 hours. The yield of the resulted copolymer 7 was 0.22 g. Copolymer 7 had a polystyrene-reduced number-average molecular weight of $3.6 \times 10^4$, and a polystyrene-reduced weight-average molecular weight of $1.2 \times 10^5$.

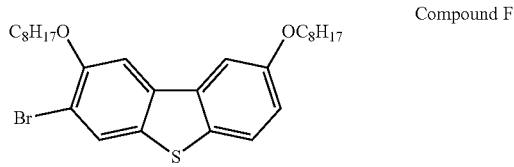

Compound F

Example 12

<Measurement of Luminance>

A device was produced in the same manner as in Example 2, except that copolymer 7 was used instead of copolymer 1. Film formation was conducted by spin coat at 1500 rpm. EL light emission was obtained showing a peak at 464 nm by applying voltage on the resulted device. The device showed light emission of 100 cd/m² at about 5.0 V. When the initial luminance was set at 100 cd/m² and attenuation of luminance was measured, then, time for 20% reduction in luminance was 120 hours.

Synthesis Example 7

Synthesis of Copolymer 8

5.0 g (8.4 mmol) of compound E, 2.4 g (3.5 mmol) of N,N'-bis(4-bromophenyl)-N,N'-bis(4-n-butylphenyl) 1,4-phenylenediamine, and 5.5 g (35 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 10 g (36 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 100 ml of 25% aqueous ammonia, 1 L of methanol and 500 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 500 mL of toluene, and 500 mL of 1 N hydrochloric acid was added to this and the mixture was stirred for 1 hour, the aqueous layer was removed and 500 mL of 4% aqueous ammonia was added to the organic layer, and the mixture was stirred for 1 hour, then, the aqueous layer was removed. 1 L of methanol was added dropwise into the organic layer and the mixture was stirred for 1 hour, the deposited precipitate was filtrated and dried under reduced pressure for 2 hours, and dissolved in 400 mL of toluene. Thereafter, the solution was passed through an alumina column (alumina amount: 100 g) for purification, and the recovered toluene solution was added dropwise into 600 mL of methanol and the mixture was stirred for 1 hour, and the deposited precipitate was filtrated and dried under reduced pressure for 2 hours. The yield of the resulted copolymer 8 was 3.2 g. Copolymer 8 had a polystyrene-reduced number-average molecular weight of $2.3 \times 10^4$, and a polystyrene-reduced weight-average molecular weight of $9.2 \times 10^4$.

Comparative Example 1

<Measurement of Luminance>

A device was produced in the same manner as in Example 2, except that copolymer 8 was used instead of copolymer 1. Film formation was conducted by spin coat at 2500 rpm. EL light emission was obtained showing a peak at 472 nm by applying voltage on the resulted device. The device showed light emission of 100 cd/m² at about 4.5 V. When the initial luminance was set at 100 cd/m² and attenuation of luminance was measured, then, time for 20% reduction in luminance was 35 hours.

Synthesis Example 8

<Synthesis of Copolymer 9>

0.40 g (0.67 mmol) of compound E, 0.20 g (0.29 mmol) of N,N'-bis(4-bromophenyl)-N,N'-bis(4-n-butylphenyl) 1,4-phenylenediamine, 3 mg (0.019 mmol) of bromobenzene and 0.38 g (2.4 mmol) of 2,2'-bipyridil were charged into a reaction vessel, then, an atmosphere in the reaction system was purged with nitrogen gas. To this was added 20 ml of tetrahydrofuran deaerated previously by bubbling with argon gas (dehydrated solvent). Then, to this mixed solution was added 0.7 g (2.5 mmol) of bis(1.5-cyclooctadiene) nickel (0), and they were reacted at 60° C. for 3 hours. The reaction was conducted in a nitrogen gas atmosphere. After the reaction, this solution was cooled, then, poured into a mixed solution of 10 ml of 25% aqueous ammonia, 120 ml of methanol and 500 ml of ion exchanged water, and the mixture was stirred for about 1 hour. Then, the produced precipitate was recovered by filtration. This precipitate was washed with ethanol, then, dried under reduced pressure for 2 hours. Next, this precipitate was dissolved in 30 mL of toluene, and 30 mL of 1 N hydrochloric acid was added to this and the mixture was stirred for 1 hour, the aqueous layer was removed and 30 mL of 4% aqueous ammonia was added to the organic layer, and the mixture was stirred for 1 hour, then, the aqueous layer was removed. 200 mL of methanol was added dropwise into the organic layer and the mixture was stirred for 1 hour, the deposited precipitate was filtrated and dried under reduced pressure for 2 hours, and dissolved in 30 mL of toluene. Thereafter, the solution was passed-through an alumina column (alumina amount: 20 g) for purification, and the recovered toluene solution was added dropwise into 250 mL of methanol and the mixture was stirred for 1 hour, and the deposited precipitate was filtrated and dried under reduced pressure for 2 hours. The yield of the resulted copolymer 9 was 0.13 g. Copolymer 9 had a polystyrene-reduced number-average molecular weight of $2.9\times10^4$, and a polystyrene-reduced weight-average molecular weight of $7.7\times10^4$.

Comparative Example 2

<Measurement of Luminance>

A device was produced in the same manner as in Example 2, except that copolymer 9 was used instead of copolymer 1. Film formation was conducted by spin coat at 2500 rpm. EL light emission was obtained showing a peak at 464 nm by applying voltage on the resulted device. The device showed light emission of 100 cd/m² at about 4.5 V. When the initial luminance was set at 100 cd/m² and attenuation of luminance was measured, then, time for 20% reduction in luminance was 17.5 hours.

Industrial Applicability

When the copolymer of the present invention is used as a light emitting material in a light emitting layer of a polymer LED, this polymer LED is excellent in properties. Therefore, this polymer LED can be preferably used in apparatuses such as light sources in the form of curve or plane for back light or illumination of liquid crystal displays, segment type display devices, flat panel displays of dot matrix, and the like. The copolymer of the present invention can be used as a coloring matter for laser, a material for organic solar battery, an organic semiconductor for organic transistor, or a material for conductive thin film.

The invention claimed is:

1. A copolymer consisting of two or more repeating units selected from the group consisting of arylene groups, divalent heterocyclic groups and divalent aromatic amine groups, with the proviso that at least one of the repeating units is a divalent aromatic amine group represented by formula (7):

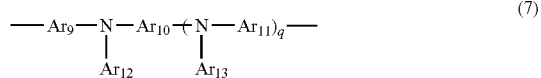

wherein $Ar_9$, $Ar_{10}$, and $Ar_{11}$ each independently represent a phenylene group, naphthalenediyl group, anthracenediyl group, phenanthrenediyl group, pentalenediyl group, indenediyl group, heptalenediyl group, indacenediyl group, stilbenediyl group or 3,3'-alkoxystilbenediyl group, and $Ar_{12}$ and $Ar_{13}$ each independently represent an aryl group; q represents an integer of 1 to 3, wherein the copolymer has, on at least one of molecular chain ends, an aromatic end group selected from a monovalent heterocyclic group and aryl groups having a formula weight of 90 or more, the aromatic end group having a substituent selected from the group consisting of alkyl groups, and the copolymer shows fluorescence in the solid state and has a polystyrene-reduced weight-average molecular weight of $10^3$ to $10^8$.

2. The copolymer according to claim 1, wherein the aryl group having a formula weight of 90 or more is an aryl group having one substituent selected from the group consisting of n-alkyl groups, i-alkyl groups and s-alkyl groups.

3. A production method of the copolymer according to 1 or 2, comprising reacting two or more monomers selected from formulae (1), (2) and (3) with a monomer of formula (4) and/or (5):

[wherein, $Ar_1$, $Ar_2$ and $Ar_3$ each independently represent an arylene group, divalent heterocyclic group or divalent aromatic amine group. $E_1$ and $E_2$ each independently represent a monovalent heterocyclic group, a monovalent group derived from a heterocyclic group coordinated metal complex, or an aryl group having a formula weight of 90 or more. $Y_1$, $Y_2$, $Y_3$, $Y_4$, $Y_5$, $Y_6$, $Y_7$ and $Y_8$ each independently represent a leaving group].

4. The production method according to claim 3, wherein monomers in which $Y_1$, $Y_2$, $Y_3$, $Y_4$, $Y_5$, $Y_6$, $Y_7$ and $Y_8$ each independently represent a halogen atom, alkylsulfonyloxy group or arylsulfonyloxy group are used, and these monomers are reacted in the presence of a Ni (0) complex.

5. The production method according to claim 3, wherein monomers are used in which $Y_1$ and $Y_2$ each independently represent a group represented by $-B(OR_{11})_2$ (wherein, $R_{11}$ represents a hydrogen atom or alkyl group); $Y_3$ and $Y_4$ each independently represent a halogen atom, alkylsulfonyloxy group or arylsulfonyloxy group; $Y_5$ and $Y_6$ each independently represent a group represented by $-B(OR_{11})_2$ (wherein, $R_{11}$ represents a hydrogen atom or alkyl group), or each independently represent a halogen atom, alkylsulfonyloxy group or arylsulfonyloxy group; $Y_7$ represents a group represented by $-B(OR_{11})_2$ (wherein, $R_{11}$ represents a hydrogen atom or alkyl group); and $Y_8$ represents a halogen atom, alkylsulfonyloxy group or arylsulfonyloxy group: and these monomers are reacted in the presence of a Pd(0) complex.

6. A copolymer produced by the method according to claim 3.

7. A polymer composition comprising a polymer compound having a polystyrene-reduced weight-average molecular weight of $10^3$ to $10^8$ and showing fluorescence in the solid state, and the copolymer according to claim 1 or 2.

8. A polymer composition comprising two or more of the copolymers according to claim 1 or 2.

9. A polymer light emitting device having a light emitting layer between electrodes composed of an anode and a cathode wherein the light emitting layer contains a copolymer according to claim 1.

10. The polymer light emitting device according to claim 9, wherein, between at least one electrode and the light emitting layer, a layer containing a conductive polymer is provided adjacent to the electrode.

11. The polymer light emitting device according to claim 9 or 10, wherein, between at least one electrode and the light emitting layer, an insulation layer having an average film thickness of 2 nm or less is provided adjacent to the electrode.

12. The polymer light emitting device according to claim 9, wherein, between the cathode and the light emitting layer, an electron transporting layer is provided adjacent to the light emitting layer.

13. The polymer light emitting device according to claim 9, wherein, between the cathode and the light emitting layer, a hole transporting layer is provided adjacent to the light emitting layer.

14. The polymer light emitting device according to claim 9, wherein, between the cathode and the light emitting layer, an electron transporting layer is provided adjacent to the light emitting layer, and between the anode and the light emitting layer, a hole transporting layer is provided adjacent to the light emitting layer.

15. A flat light source comprising the polymer light emitting device according to claim 9.

16. A segment display comprising the polymer light emitting device according to claim 9.

17. A dot matrix display comprising the polymer light emitting device according to claim 9.

18. A liquid crystal display having the polymer light emitting device according to claim 9 as back light.

19. The copolymer according to claim 1 having an arylene group and a divalent aromatic amine group as repeating units.

20. The copolymer according to claim 1 having a divalent heterocyclic group and a divalent aromatic amine group as repeating units.

21. The copolymer according to claim 1 consisting of one or more arylene group(s), and one or more divalent aromatic amines (1) and one or more divalent aromatic amines (2) as repeating units, wherein the divalent aromatic amines (1) and (2) are different from each other in structure.

22. The copolymer according to claim 1 consisting of one or more arylene groups (1) and one or more arylene groups (2), and one or more divalent aromatic amine as repeating units, wherein the arylene groups (1) and (2) are different from each other in structure.

23. The copolymer according to claim 1 consisting of one or more divalent heterocyclic group(s) (1) and one or more divalent heterocyclic group(s) (2), and one or more divalent aromatic amine(s) as repeating units, wherein the divalent heterocyclic group(s) (1) and (2) are different from each other in structure.

24. The copolymer according to claim 1 consisting of one or more divalent heterocyclic group(s) and one or more divalent aromatic amines (1) and one or more divalent aromatic amines (2) as repeating units, wherein the divalent aromatic amines (1) and (2) are different from each other in structure.

* * * * *